United States Patent
Moon et al.

(10) Patent No.: US 8,698,527 B2
(45) Date of Patent: Apr. 15, 2014

(54) CIRCUIT AND METHOD FOR PREVENTING FALSE LOCK AND DELAY LOCKED LOOP USING THE SAME

(75) Inventors: Yong Hwan Moon, Incheon-si (KR); Young Soo Ryu, Goyang-si (KR); Jae Ryun Shim, Daejeon-si (KR); Chul Soo Jeong, Daejeon-si (KR); Sang Ho Kim, Gunpo-si (KR)

(73) Assignee: Silicon Works Co., Ltd., Daejeon-Si (KR)

( * ) Notice: Subject to any disclaimer, the term of this patent is extended or adjusted under 35 U.S.C. 154(b) by 6 days.

(21) Appl. No.: 13/482,948

(22) Filed: May 29, 2012

(65) Prior Publication Data

US 2012/0306551 A1 Dec. 6, 2012

(30) Foreign Application Priority Data

May 31, 2011 (KR) .................. 10-2011-0052148

(51) Int. Cl.
*H03L 7/06* (2006.01)
(52) U.S. Cl.
USPC .......................................... 327/149; 327/158
(58) Field of Classification Search
None
See application file for complete search history.

(56) References Cited

U.S. PATENT DOCUMENTS

| | | | | |
|---|---|---|---|---|
| 7,233,182 | B1 * | 6/2007 | Savoj | 327/141 |
| 7,271,634 | B1 * | 9/2007 | Daga et al. | 327/149 |
| 8,368,445 | B2 * | 2/2013 | Lin et al. | 327/158 |
| 2008/0042703 | A1 * | 2/2008 | Sha et al. | 327/158 |

FOREIGN PATENT DOCUMENTS

| | | |
|---|---|---|
| JP | 2000-22524 | 1/2000 |
| JP | 2000-224029 | 8/2000 |
| JP | 2001-168711 | 6/2001 |
| JP | 2004-350116 | 12/2004 |
| JP | 2005-136964 | 5/2005 |
| JP | 2006-129422 | 5/2006 |
| JP | 2009-147829 | 7/2009 |
| JP | 2011-55482 | 3/2011 |

OTHER PUBLICATIONS

A Low-Power Small-Area 7.28-ps-Jitter 1-GHz DLL-Based Clock Generator, Chulwoo Kim, IEEE Journal of Solid-State Circuits, vol. 37, No. 11, Nov. 2002, pp. 1414-1420.
An All-Analog Multiphase Delay-Locked Loop Using a Replica Delay Line for Wide-Range Operation and Low-Jitter Performance, IEEE Journal of Solid-State Circuits, vol. 35, No. 3, Mar. 2000, pp. 377-384.

* cited by examiner

*Primary Examiner* — Cassandra Cox
(74) *Attorney, Agent, or Firm* — Kile Park Reed & Houtteman PLLC

(57) ABSTRACT

The present invention relates to a false lock prevention circuit and method which is used to cause a delayed locked loop (DLL) to escape from false lock such as harmonic lock or stuck lock, when the false lock occurred in the DLL, and a DLL using the same. The false lock prevention circuit includes a harmonic lock detector configured to detect harmonic lock and a stuck lock detector configured to detect stuck lock. The harmonic lock detector includes a plurality of flip-flops configured to sample a plurality of delayed clocks and a logic unit. The harmonic lock detector compares a reference clock signal with the plurality of delayed clock signals, and detects whether or not the positive edges deviate from one cycle of the reference clock signal.

22 Claims, 21 Drawing Sheets

CIRCUIT AND METHOD FOR PREVENTING FALSE LOCK AND DELAY LOCKED LOOP USING THE SAME

TECHNICAL FIELD

The present invention relates to a delay locked loop (DLL), and more particularly, to technology for preventing false lock when generating multi-phase clock signals using a reference clock signal.

BACKGROUND ART

In general, a DLL refers to a circuit which generates multi-phase clock signals obtained by delaying a reference clock signal REF through a delay line.

FIG. 1 is a block diagram illustrating the configuration of a conventional DLL.

Referring to FIG. 1, the conventional DLL 30 includes a phase detector 31, a charge pump 32, a low-pass filter 33, a voltage controlled delay line (VCDL) 34. The phase detector 31 is configured to compare a N-th positive edge of a reference clock signal REF to an (N−1)-th positive edge of a feedback clock signal FEB, and output a phase difference signal UP/DOWN corresponding to the phase difference therebetween. The charge pump 32 is configured to generate a phase difference current corresponding to the phase difference signal UP/DOWN. The low-pass filter 33 is configured to convert the phase difference current into a voltage signal and generate a control voltage Vctrl. The VCDL 34 is configured to generate multi-phase clock signals by adjusting a delay time of the reference clock signal REF in response to the control voltage Vctrl.

The multi-phase clock signals include delayed clock signals obtained by delaying the reference clock signal REF by predetermined phase differences. Among the multi-phase clock signals, the final delayed clock signal which is synchronized with the reference clock signal REF by delaying the reference clock signal REF by one cycle becomes the feedback clock signal FEB provided to the phase detector 31.

FIG. 2 is a block diagram illustrating the configuration of the phase detector of FIG. 1.

Referring to FIG. 2, when the phase of the reference clock signal REF leads the phase of the feedback clock signal FEB, a first flip-flop FF1 first activates and outputs the up signal UP. A second flip-flop FF2 activates and outputs the down signal DOWN after a time based on the phase difference between the reference clock signal REF and the feedback clock signal FEB. An AND gate AD resets the first and second flip-flops FF1 and FF2 when both of the up signal UP and the down signal DOWN are activated.

When the phase of the feedback clock signal FEB leads the phase of the reference clock signal REF, the second flip-flop FF2 first activates and outputs the down signal DOWN. When the first flip-flop FF1 activates and outputs the up signal UP after a time based on the phase difference, the AND gate AD resets the first and second flip-flops FF1 and FF2.

When the phase of the reference clock signal REF is identical to the phase of the feedback clock signal FEB, the first and second flip-flops FF1 and FF2 activate the up signal UP and the down signal DOWN at the same time, and are reset by the AND gate AD. When the feedback clock signal FEB is delayed by one cycle from the reference clock signal REF and synchronized with the reference clock signal REF, the DLL 30 becomes in a normal lock state.

When designing the DLL 30, it is important to design the DLL 30 such that false lock does not occur. The false lock problem of the DLL 30 includes harmonic lock and stuck lock.

The harmonic lock refers to a state in which the DLL 30 maintains a false lock state when the delay time of the feedback clock signal FEB delayed from the reference clock signal REF corresponds to integer multiples of one cycle T1 of the reference clock signal REF, for example, two cycles T2, three cycles T3, and four cycles T4. In the harmonic lock state, the reference clock signal REF and the feedback clock signal FEB are synchronized without a difference phase. Therefore, the DLL 30 determines that the harmonic lock state is a normal lock state.

FIG. 3 is a timing diagram of multi-phase clock signals when the conventional DLL is in a normal lock state. FIG. 4 is a timing diagram of multi-phase clock signals when the conventional DLL is in a harmonic lock state (two cycles). FIG. 5 is a timing diagram of multi-phase clock signals when the conventional DLL is in another harmonic lock state (three cycles).

In FIGS. 3 to 5, the multi-phase clock signals include first to 14th delayed clock signals CLK1 to CLK14, and the 14th delayed clock signal becomes the feedback clock signal FEB obtained by finally delaying the reference clock signal REF. Arrows illustrated under the down signal DOWN indicate positive edges of the reference clock signal REF and the first to 14th delayed clocks CLK1 to CLK14. Here, the multi-phase clock signals including 14 delayed clock signals CLK1 to CLK14 was taken as an example, and phase differences between the respective arrows are equal to each other. Therefore, in a normal lock state as illustrated in FIG. 3, the phase difference corresponds to a value obtained by equally dividing one cycle 1T by 14. Furthermore, in the harmonic lock state of two cycles 2T as illustrated in FIG. 4, the phase difference corresponds to a value obtained by equally dividing two cycles 2T by 14. Furthermore, in the harmonic lock state of three cycles 3T as illustrated in FIG. 5, the phase difference corresponds to a value obtained by equaling dividing three cycles 3T by 14.

Referring to FIGS. 3 to 5, the phases of the reference clock signal REF and the feedback clock signal FEB commonly coincide with each other in the normal lock state and the harmonic lock state of the conventional DLL. Therefore, the conventional DLL may determine that both of the normal lock state and the harmonic lock state are a normal lock state.

The stuck lock occurs when the DLL 30 operates in a direction to continuously reduce the delay time even though the delay time of the VCDL 34 has already approached the minimum delay time. As described above, the phase detector 31 compares an N-th positive edge of the reference clock signal REF to an (N−1)-th positive edge of the feedback clock signal FEB, and generates the phase difference signal UP/DOWN. When the phase detector 31 falsely compares the reference clock signal REF to the feedback clock signal FEB and generates a false phase difference signal UP/DOWN, the stuck lock state occurs. For example, suppose that the control voltage Vctrl already approaches a power supply voltage VDD in a DLL where the VCDL 34 has a minimum delay time. In this case, for a normal operation, the phase detector 31 must increase the delay time by generating the down signal DOWN to decrease the control voltage Vctrl. However, when the phase detector 31 falsely compares the reference clock signal REF to the feedback clock signal FEB and generates the up signal UP to increase the control voltage Vctrl, the DLL 30 falls in the stuck lock state where the DLL 30 does not operate, because the control voltage Vctrl already approaches the power supply voltage VDD which is the maximum voltage and is fixed to the power supply voltage VDD.

FIG. 6 is a timing diagram of multi-phase clock signals, an abnormal signal, and a normal signal when the conventional DLL is in the stuck lock state. Here, a DLL where a VCDL has a minimum delay time when a control voltage is a power supply voltage is taken as an example.

Referring to FIG. 6, when the phase detector 31 compares an N-th positive edge of the reference clock signal REF to an (N−1)-th positive edge of the feedback clock signal FEB, the phase detector 31 may determine that the phase of the feedback clock signal FEB leads the phase of the reference clock signal REF, and output a normal signal as the down signal DOWN. In this case, the DLL 30 normally operates.

On the other hand, when the phase detector 31 compares the phases of the reference clock signal REF and the feedback clock signal FEB, the phase detector 31 may compare an N-th positive edge of the reference clock signal REF to an N-th positive edge of the feedback clock signal FEB, misjudge that the phase of the reference clock signal REF leads the phase of the feedback clock signal FEB, and output an abnormal signal as the up signal UP. In this case, the DLL 30 falls in the stuck lock state, and does not normally operate.

Although not illustrated in FIG. 6, the stuck lock may occur in a DLL where the VCDL 34 has a minimum delay time when the control voltage Vctrl is a ground voltage VSS.

When the control voltage Vctrl is the ground voltage VSS, the phase detector 31 must reduce the delay time by generating the up signal UP to increase the control voltage Vctrl, for a normal operation. However, when the phase detector 31 falsely compares the reference clock signal REF and the feedback clock signal FEB and generates the down signal DOWN to decrease the control voltage Vctrl, the DLL 30 falls in the stuck lock state where the DLL 30 does not operate, because the control voltage Vctrl already approaches the ground voltage VSS as the minimum voltage and is fixed to the ground voltage VSS.

FIG. 7 is a state diagram of the phase detector of the conventional DLL.

Referring to FIG. 7, when the phase of the reference clock signal REF leads the phase of the feedback clock signal FEB (Early REF), the up signal UP is activated to '1', and when the phase of the feedback clock signal FEB leads the phase of the reference clock signal REF (Late REF), the down signal DOWN is activated to '1'. When the phases of the reference clock signal REF and the feedback clock signal FEB coincide with each other and are synchronized with each other (Same REF & FEB), the up signal UP and the down signal DOWN are finally deactivated to '0' to maintain the lock state as it is. Referring to FIG. 7, however, it can be seen that the state diagram of the phase detector of the conventional DLL is not provided with a function for preventing false lock such as the harmonic lock or the stuck lock.

Recently, research has been actively conducted on a variety of methods for preventing false lock and expanding a lock range in a DLL. One of the methods is to use a phase detector having a reset circuitry (IEEE Journal of Solid-State Circuits, Vol. 37, No. 11, November 2002) (title: A low-power small-area +−7.28-ps-jitter 1-GHz DLL-based clock generator). Hereinafter, this paper is referred to as a reference document 1.

However, the method disclosed in the reference document 1 has limitations in that it must start from a time point where a delay time of a VCDL is the smallest before a DLL operates, and a delay range VCDL_delay of the VCDL must satisfy a condition of "0<VCDL_delay<1.5 cycle".

Furthermore, in the method disclosed in the reference document 1, stuck lock may occur when the initial state of the DLL differs because of a certain reason or the phase detector falsely compares a feedback clock signal and a reference clock signal at least once because of various factors during the operation of the DLL.

Another method for preventing false lock and expanding a lock range in a DLL is to use a replica delay line (IEEE Journal of Solid-State Circuits, Vol. 35, No. 3, March 2002) (title: An all-analog multiphase delay-locked loop using replica delay line for wide-range operation and low-jitter performance). Hereinafter, this paper is referred to as a reference document 2.

The reference document 2 proposes a wide-range DLL using a replica delay line. In the method disclosed in the reference document 2, the replica delay line includes a current steering phase detector (CSPD) and a low-pass filter, and a current ratio of a charge pump of the CSPD must be set with precision.

However, the wide-range DLL proposed in the reference document 2 may be used only when a duty rate of a reference clock signal is a predetermined rate, for example, 50%, and the current ratio of a current pump used in the replica delay line must be designed with precision.

DISCLOSURE

Technical Problem

Accordingly, the present invention has been made in an effort to solve the problems occurring in the related art, and an object of the present invention is to provide a false lock prevention circuit and method for preventing false lock by detecting a harmonic lock state when generating multi-phase clock signals synchronized by delaying a reference clock signal, and a DLL using the same.

Another object of the present invention is to provide a false lock prevention circuit and method for preventing a stuck lock state by detecting a stuck lock state when generating multi-phase clock signals synchronized by delaying a reference clock signal.

Technical Solution

In order to achieve the above object, according to one aspect of the present invention, there is provided a false lock prevention circuit which generate a plurality of clock signals delayed from a reference clock signal, and includes a detector configured to detect a false lock state in which transition edges of one or more clock signals among the plurality of delayed clock signals deviate from one cycle of the reference clock signal and are falsely locked at integer multiple cycles of the reference clock signal, such as two cycles or three cycles. The detector includes a clock sampler having a plurality of flip-flops, another clock sampler having a plurality of flip-flops, and a logic unit, and detects a false lock state by sampling the delayed clock signals.

According to another aspect of the present invention, a DLL includes a phase detector configured to detect a phase difference between a reference clock signal and a feedback clock signal; a charge pump configured to source or sink a current in response to the detection result; and a false lock prevention circuit configured to detect false lock of the reference clock signal and the feedback clock signal using a plurality of delayed clock signals which are generated by a voltage controlled delay line (VCDL) and among which delay time intervals are increased or decreased according to change in control voltage generated by a low-pass filter. The false lock prevention circuit includes one or more detectors for detecting two kinds of false lock states having different causes.

According to still another aspect of the present invention, a false lock prevention circuit includes a false lock detector configured to select an output signal of a phase detector and one of a plurality of clock signals delayed from a reference clock signal, perform a logic operation on the selected signals, and detect that false lock occurred according to the operation result. The phase detector is set by the detection and escapes from the false lock state.

Advantageous Effects

According to the embodiments of the present invention, since the false lock prevention circuit detects a harmonic lock state using positive edges of delayed clock signals when detecting a harmonic lock state of a DLL, the false lock prevention circuit may prevent false lock without receiving an effect of a duty rate of a reference clock signal. Furthermore, the false lock prevention circuit selects one of the delayed clock signals and uses the elected clock signal as a sampling clock signal for detecting a harmonic lock state, thereby expanding the maximum delay range.

Furthermore, since the phase detector may be set using a stuck lock signal when a reference clock signal and a feedback clock signal are falsely compared, it is possible to prevent the DLL from falling in a stuck lock state.

BRIEF DESCRIPTION OF THE DRAWINGS

The above objects, and other features and advantages of the present invention will become more apparent after a reading of the following detailed description taken in conjunction with the drawings, in which.

BEST MODE FOR THE INVENTION

Figure 1:
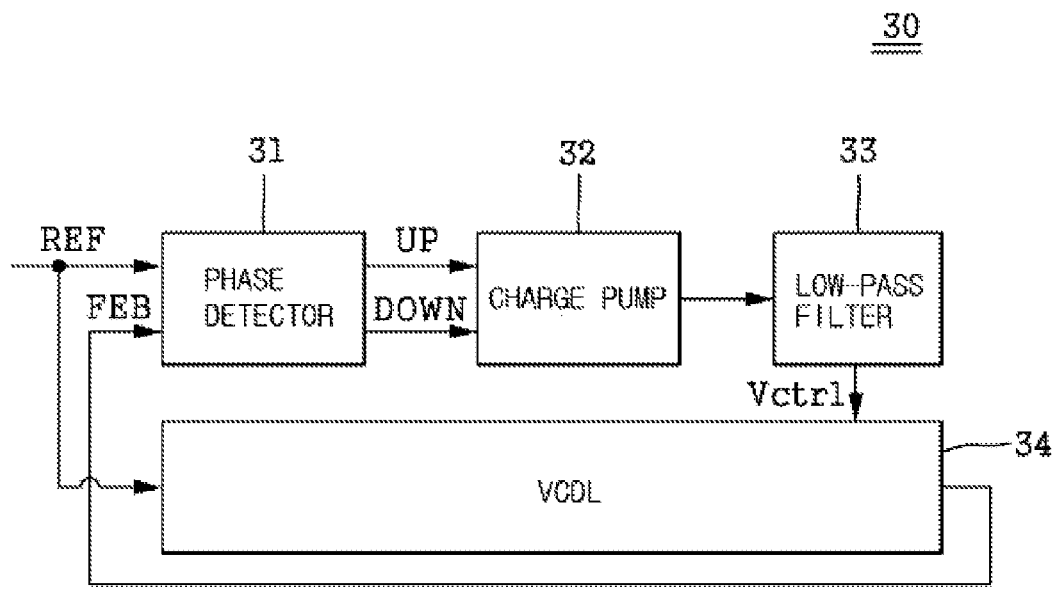
FIG. 1 is a block diagram illustrating the configuration of a conventional DLL.
Figure 2:
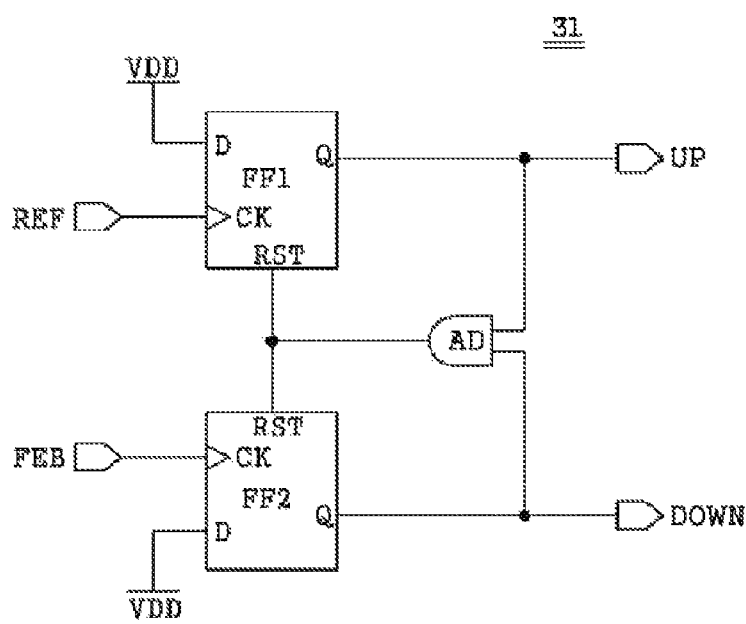
FIG. 2 is a block diagram illustrating the configuration of a phase detector of FIG. 1.
Figure 3:
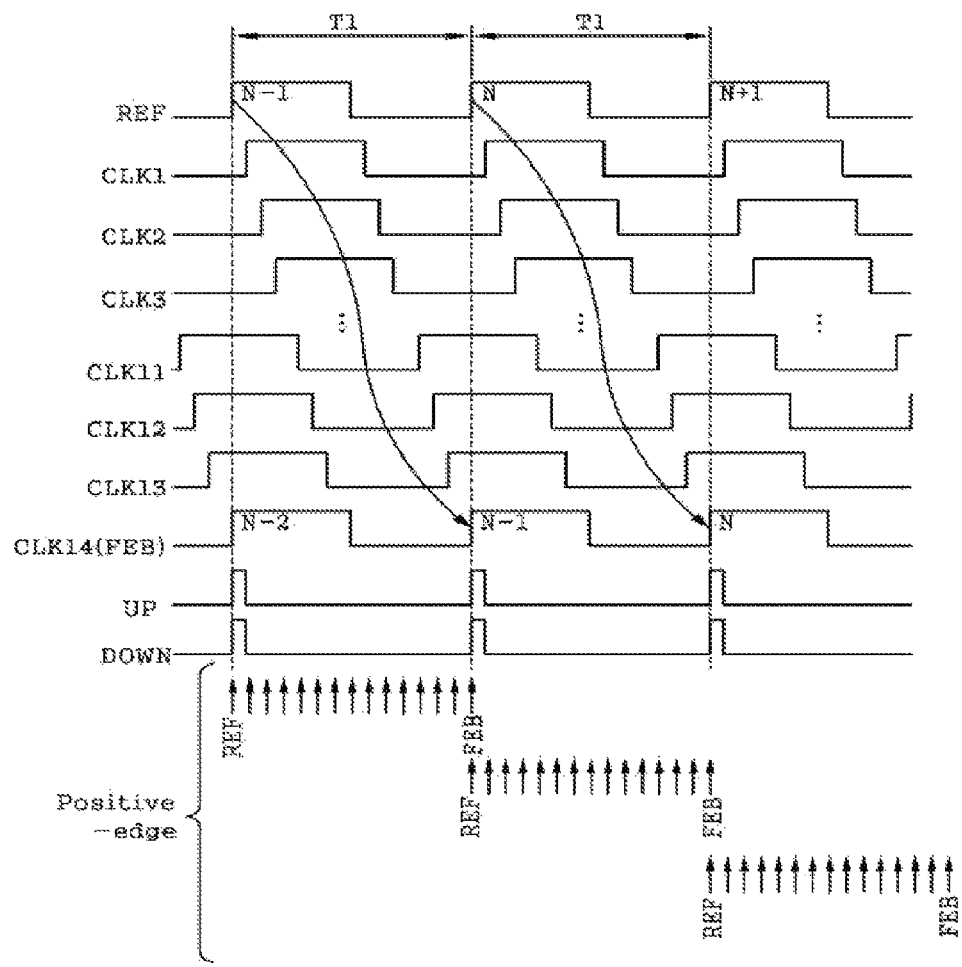
FIG. 3 is a timing diagram of multi-phase clock signals when the conventional DLL is in a normal lock state.
Figure 4:
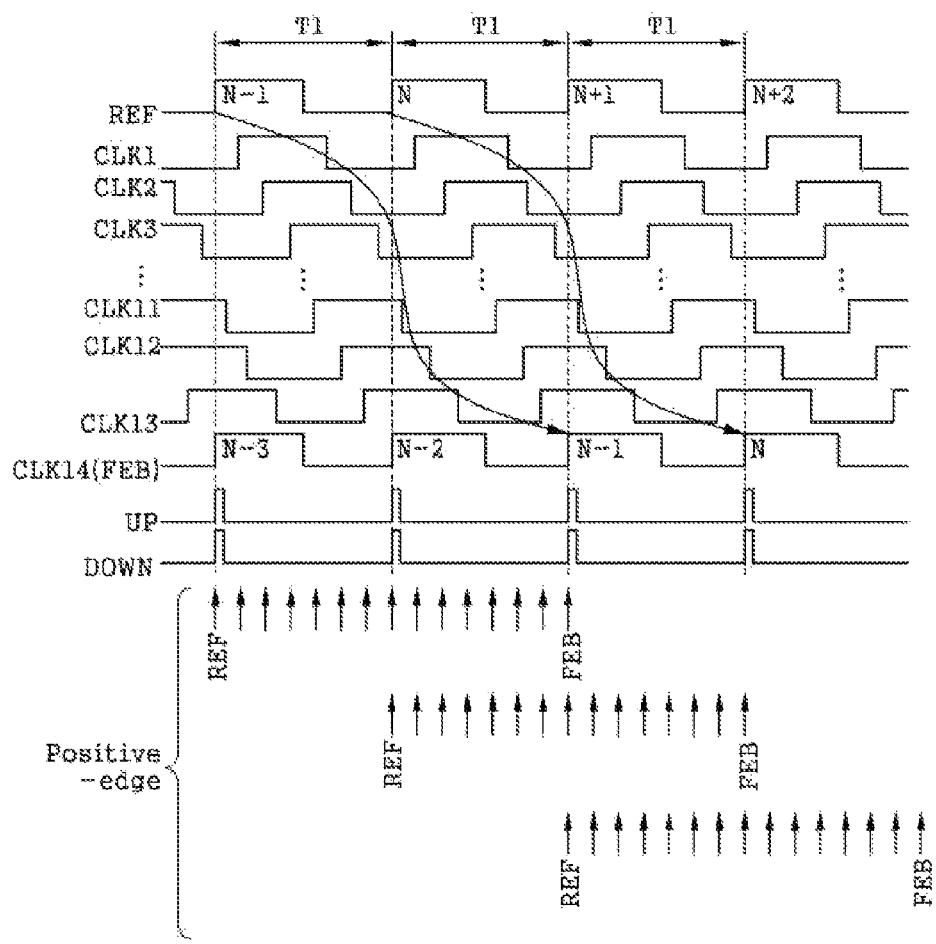
FIG. 4 is a timing diagram of multi-phase clock signals when the conventional DLL is in a harmonic lock state (two cycles)
Figure 5:
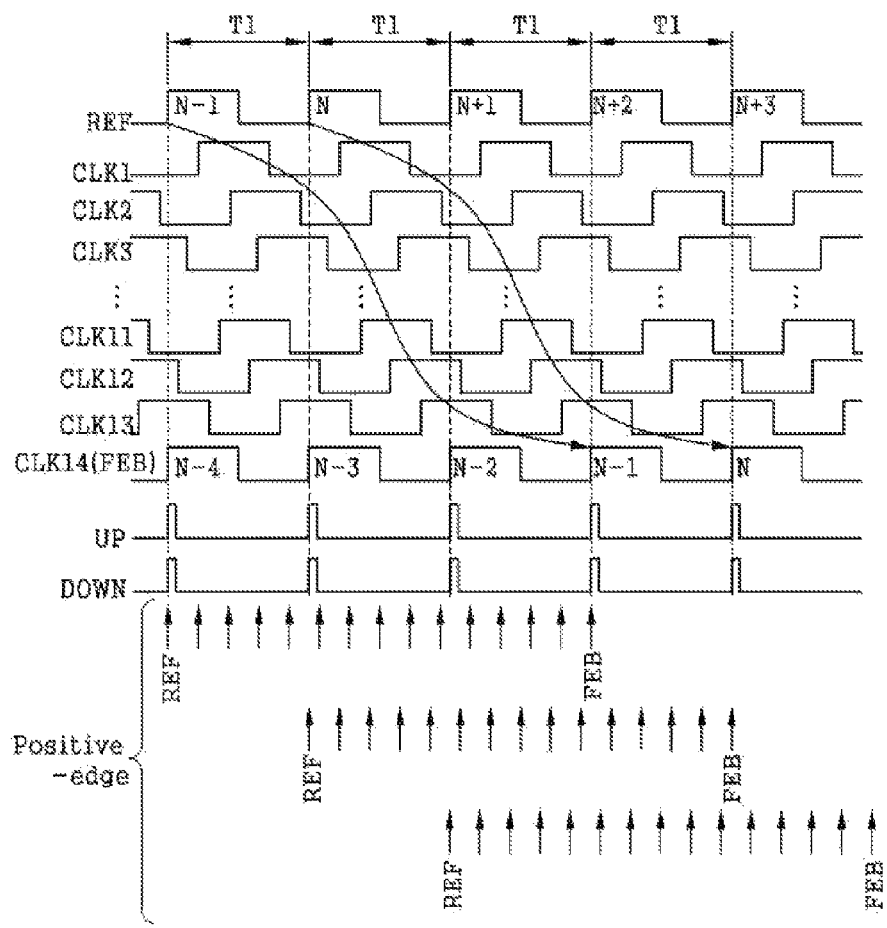
FIG. 5 is a timing diagram of multi-phase clock signals when the conventional DLL is in another harmonic lock state (three cycles)
Figure 6:
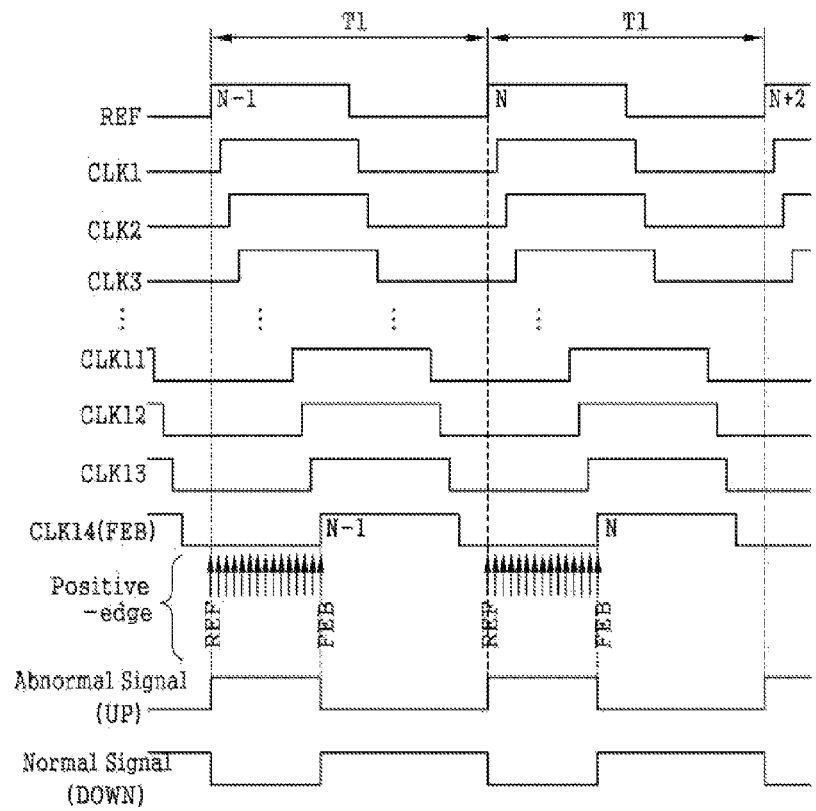
FIG. 6 is a timing diagram of multi-phase clock signals, an abnormal signal, and a normal signal when the conventional DLL is in the stuck lock state.
Figure 7:
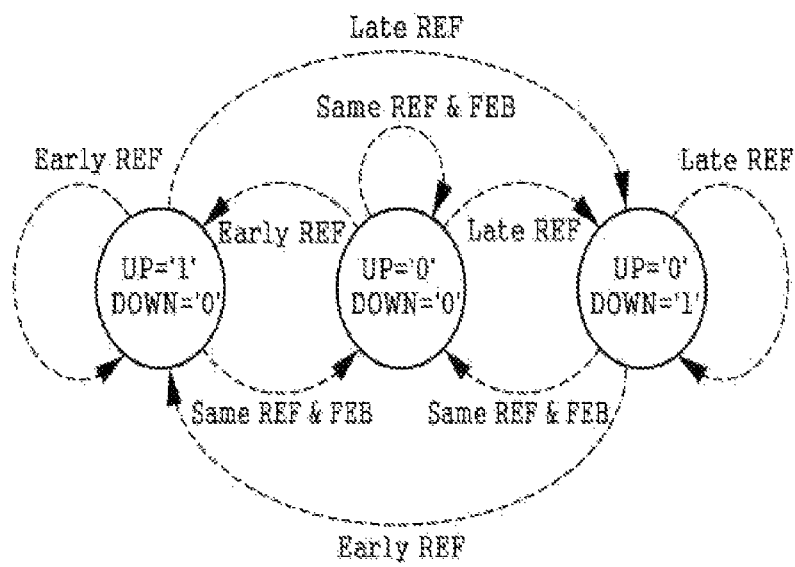
FIG. 7 is a state diagram of the phase detector of the conventional DLL.

Reference will now be made in greater detail to a preferred embodiment of the invention, an example of which is illustrated in the accompanying drawings. Wherever possible, the same reference numerals will be used throughout the drawings and the description to refer to the same or like parts.

Figure 8:
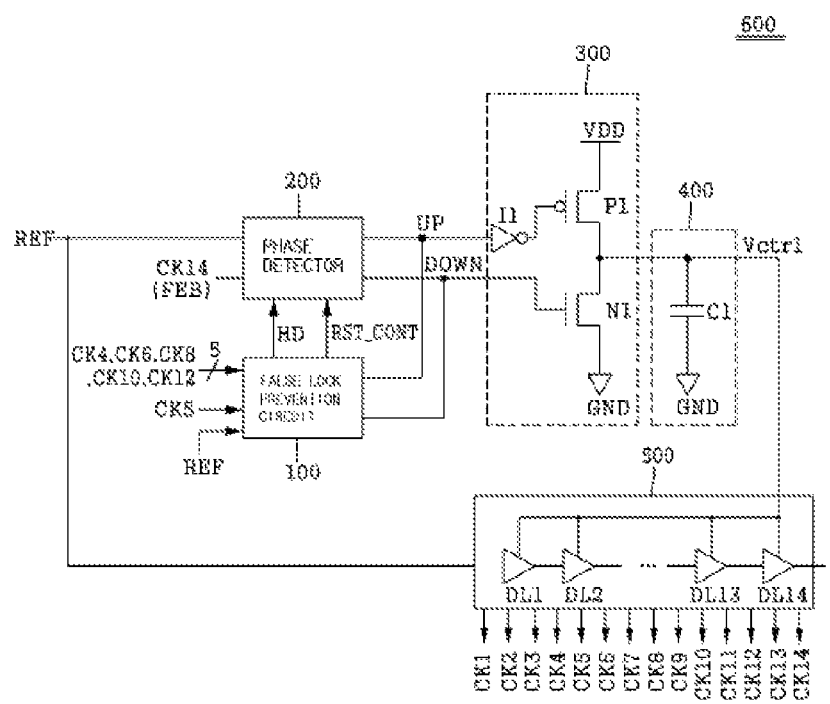
FIG. 8 is a block diagram of a DLL according to an embodiment of the present invention.

FIG. 8 is a block diagram of a DLL according to an embodiment of the present invention.

Referring to FIG. 8, the DLL 600 according to the embodiment of the present invention includes a false lock prevention circuit 100, a phase detector 200, a charge pump 300, a low-pass filter 400, a voltage controlled delay line (VCDL) 500. The DLL 600 is configured to generate a feedback clock signal FEB by delaying a reference clock signal REF by one cycle through the VCDL 500, and synchronize the reference clock signal REF and the feedback clock signal FEB.

The VCDL 500 includes first to 14th delay elements DL1 to DL14, and is configured to generate delayed clock signals CK1 to CK14 by controlling phase delay of the reference clock signal REF in response to a control voltage Vctrl supplied through the low-pass filter 400. The VCDL 500 has the minimum delay time when the control voltage Vctrl is a power supply voltage VDD, and has such a structure that the delay time increases as the control voltage Vctrl gradually decreases.

Depending on a designer's choice, the VCDL 500 may be designed to have the minimum delay time when the control voltage Vctrl is the power supply voltage VDD or have the minimum delay time when the control voltage Vctrl is the ground voltage VSS.

The delayed clock signals CK1 to CK14 include the first to 14th clock signals CK1 to CK14 generated in correspondence to the first to 14th delay elements DL1 to DL14. Phase differences among the first to 14th delayed clock signals CK1 to CK14 are equal to each other. In a normal lock state, the phase difference between the respective delayed clock signals CK1 to CK14 may be obtained by dividing one cycle of the reference clock signal REF by 14 which is the number of delayed clocks.

Among the delayed clock signals CK1 to CK14, the 14th delayed clock signal CK14 which is finally outputted may be used as the feedback clock signal FEB inputted to the phase detector 200. Among the delayed clock signals CK1 to CK14, the fourth delayed clock signal CK4, the sixth delayed clock signal CK6, the eighth delayed clock signal CK8, the tenth delayed clock CK10, and the 12th delayed clock signal CK12 may be used as sampling clock signals inputted to the false lock prevention circuit 100. Among the delayed clock signals CK1 to CK14, a delayed clock signal having an intermediate delay value, for example, the fifth delayed clock signal CK5 may be used as an intermediate delayed clock signal inputted to the false lock prevention circuit 100.

The false lock prevention circuit 100 generates a harmonic lock signal HD by sampling the reference clock signal REF using the clock signals CK4, CK6, CK8, CK10, and CK12, and generates a stuck lock signal RST_CONT using a phase difference signal UP/DOWN and the intermediate delayed clock CK5. The phase difference signal UP/DOWN includes a down signal DOWN to decrease the control voltage Vctrl and an up signal UP to increase the control voltage Vctrl.

The phase detector 200 is configured to compare the reference clock signal REF and the feedback clock signal FEB and output the phase difference signal UP or DOWN based on the phase difference between the reference clock signal REF and the feedback clock signal FEB. The phase detector 200 activates and outputs the up signal UP when the phase of the reference clock signal REF leads the phase of the feedback clock signal FEB, and activates and outputs the down signal DOWN when the phase of the feedback clock signal FEB leads the phase of the reference clock signal REF.

The phase detector 200 compares an N-th positive edge of the reference clock signal REF to an (N−1)-th positive edge of the feedback clock signal FEB, in order to correctly compare the reference clock signal REF and the feedback clock signal FEB. The (N−1)-th positive edge of the feedback clock signal FEB is obtained by delaying the N-th positive edge of the reference clock signal REF by one period 1T through the VCDL 500.

When the harmonic lock signal HD is activated and inputted, the phase detector 200 generates the up signal UP to reduce phase delay of the VCDL 500. When the stuck lock signal RST_CONT is activated and inputted, the phase detector 200 is reset to perform the operation of correctly comparing the reference clock signal REF and the feedback clock signal FEB once more from the beginning.

The charge pump 300 is configured to generate an up current in response to the up signal UP and generate a down current in response to the down signal DOWN. The charge pump 300 may include a PMOS transistor P1 and an NMOS transistor N1 which are connected in series between a power supply voltage VDD and a ground GND. The up signal UP may be inputted to a control terminal of the PMOS transistor P1 through an inverter I1, and the down signal DOWN may be inputted to a control terminal of the NMOS transistor N1.

The low-pass filter 400 is configured to convert the up current or down current into a voltage signal, and generate the control voltage Vctrl from which high-frequency components are removed. The low filter 400 may include a capacitor C1 having one end connected to an output terminal of the charge pump 300 and the other end connected to the ground GND.

Figure 9:
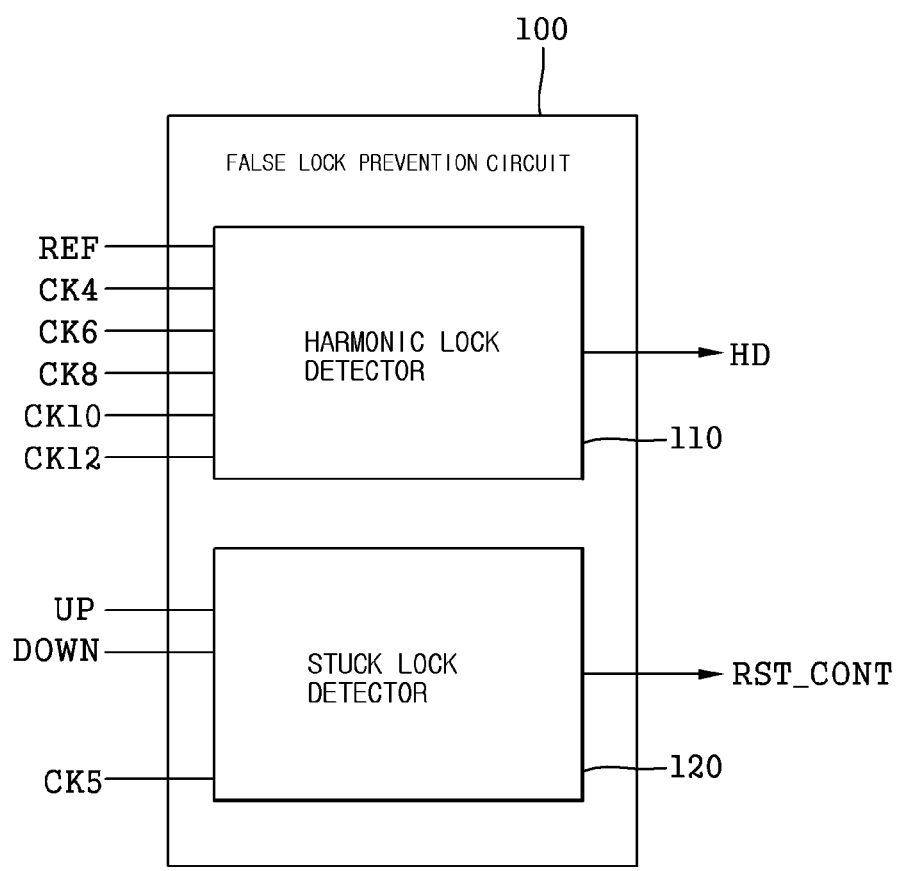
FIG. 9 is a block diagram illustrating the configuration of a false lock prevention circuit of FIG. 8.

FIG. 9 is a block diagram illustrating the configuration of the false lock prevention circuit of FIG. 8.

Referring to FIG. 9, the false lock prevention circuit 100 includes a harmonic lock detector 110 configured to sample the reference clock signal REF with the clock signals CK4, CK6, CK8, CK10, and CK12 and then generate the harmonic lock signal HD. Furthermore, the false lock prevention circuit 100 includes a stuck lock detector 120 configured to generate the stuck lock signal RST_CONT using the phase difference signal UP/DOWN and the intermediate delayed clock signal CK5. The false lock prevention circuit 100 may include only one or both of the harmonic lock detector 110 and the stuck lock detector 120.

Figure 10:
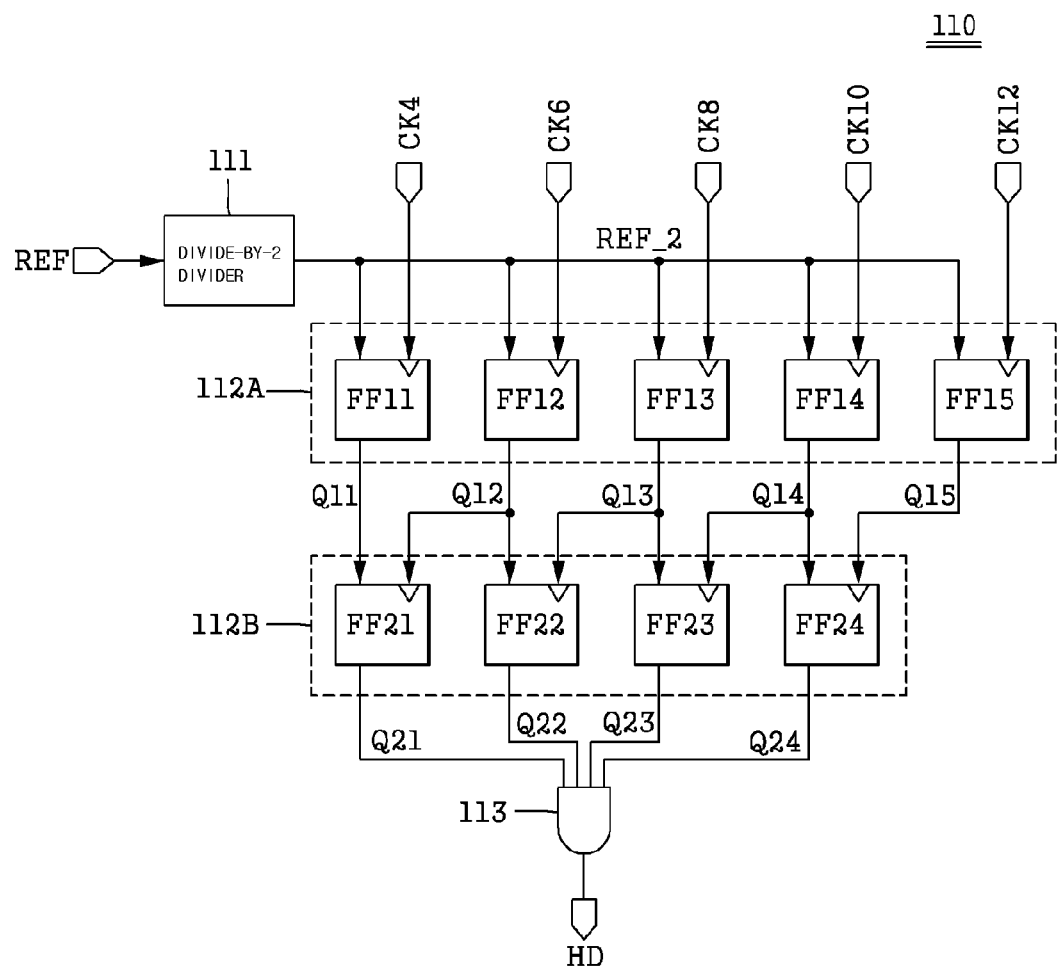
FIG. 10 is a circuit diagram of a harmonic lock detector illustrated in FIG. 9.

FIG. 10 is a circuit diagram of the harmonic lock detector 110 illustrated in FIG. 9.

Referring to FIG. 10, the harmonic lock detector 110 includes a divider 111, a first sampler 112A, a second sampler 112B, and an AND gate 113.

The divider 111 is configured to output a signal REF 2 divided by two from the reference clock signal REF.

The first sampler 112A includes first to fifth flip-flops FF11 to FF15. The divided-by-2 signal REF2 is sampled by the first to fifth flip-flops FF11 to FF15 using the clock signals CK4, CK6, CK8, CK10, and CK12, respectively, and then converted into output signals Q11 to Q15. The first to fifth flip-flops FF11 to FF15 may include D flip-flops.

The second sampler 112B includes sixth to ninth flip-flops FF21 to FF24. Among the output signals Q11 to Q15 of the first sampler 112A, the output signals Q11 to Q14 are sampled once more by the sixth to ninth flip-flops FF21 to FF24 which are designed to recognize the output signals Q12 to Q15 as clock signals, and then converted into output signals Q21 to Q24. The sixth to ninth flip-flops FF21 to FF24 may include D flip-flops.

The AND gate 113 is configured to perform an AND operation on the output signals Q21 to Q24 outputted from the sixth to ninth flip-flops FF21 to FF24, and output the harmonic lock signal HD.

Hereinafter, the principle in which the harmonic lock detector 110 detects harmonic lock will be described in more detail as follows.

When all positive edges of the clock signals CK4, CK6, CK8, and CK10 used in the first sampler 112A exist within a one-cycle period of the reference clock signal REF, the harmonic lock detector 110 outputs the harmonic lock signal HD at a high level such that the DLL 600 normally operates.

When the harmonic lock signal HD is outputted at a high level, the phase detector 200 compares the phases of the reference clock signal REF and the feedback clock signal FEB and outputs the up signal UP or the down signal DOWN. That is, since harmonic lock does not yet occur, the DLL is in a normal lock state where the synchronization between the reference clock signal REF and the feedback clock signal FEB is continuously maintained by the up signal UP or the down signal DOWN.

When one or more of the positive edges of the clock signals CK4, CK6, CK8, and CK10 used in the first sampler 112A do not exist in the one-cycle period of the reference clock signal REF, the harmonic lock detector 110 determines that the harmonic lock state occurred or the current state deviates from a range in which the harmonic lock detector 110 may detect a normal lock state, and activates the harmonic lock signal HD to a low level (active low). When the harmonic lock signal HD is outputted at a low level, it means that harmonic lock occurred. Therefore, the phase detector 200 outputs the down signal DOWN to reduce the delay time of the VCDL 500 regardless of how much phase difference there is between the reference clock signal REF and the feedback clock signal FEB. According to this operation, the delay time of the feedback clock signal FEB is gradually reduced, and the DLL finally falls in a normal lock state when the VCDL has a one-cycle delay time from the reference clock signal REF.

In this embodiment of the present invention, whether the harmonic lock occurred or not was determined according to whether the positive edges of the clock signals exist or not. Depending on design change, however, whether the harmonic lock occurred or not may be determined according to whether the negative edges of the clock signals exist or not.

In this embodiment of the present invention, it has been described that the harmonic lock detector 110 activates the harmonic lock signal HD to a low level when detecting a harmonic lock state, and outputs the harmonic lock signal HD to a high level when not detecting a harmonic lock state. However, the present invention is not limited thereto, but the harmonic lock signal HD may be outputted at a different logic level.

Furthermore, it has been described that the first sampler 112A samples the divided-by-2 signal REF 2 using five flip-flops FF11 to FF15, and the second sampler 112B samples the first to fourth sampling signals Q11 to Q14 using four flip-flops FF21 to FF24. However, the number of flip-flops and the divided signal may be changed in various manners depending on an applied circuit and the environment.

Figure 11:
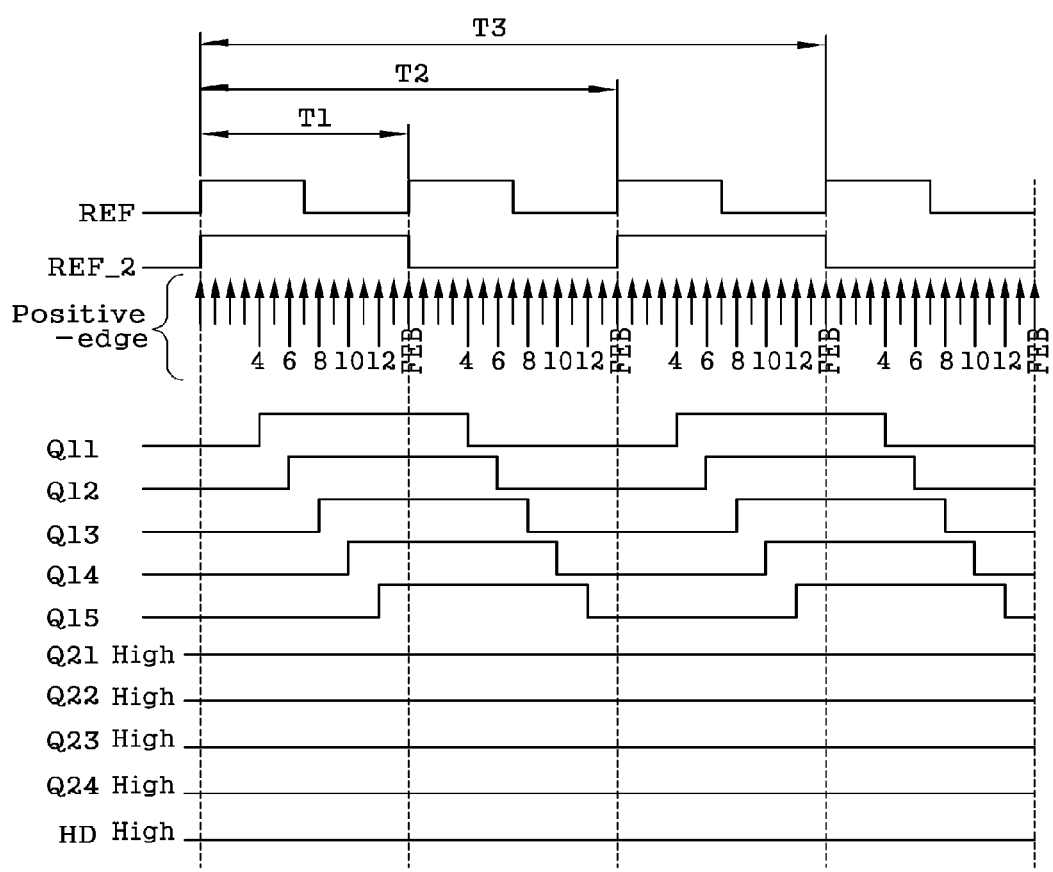
FIG. 11 is an operation timing diagram of the harmonic lock detector in a normal lock state.

FIG. 11 is an operation timing diagram of the harmonic lock detector in a normal lock state. In FIG. 11, '4', '6', '8', '10', and '12' represent the positive edges of the clock signals CK4, CK6, CK8, CK10, and CK12 used in harmonic lock detection.

Referring to FIG. 11, since all positive edges of the clock signals CK4, CK6, CK8, CK10, and CK12 exist within each cycle of the reference clock signal REF, the harmonic lock detector 110 outputs the harmonic lock signal HD at a high level. This means that the DLL 600 normally operates. In this case, the first to fifth flip-flops FF11 to FF15 of the first sampler 112A output the first to fifth output signals Q11 to Q15 having the same delay interval as a delay interval between the respective clock signals CK4, CK6, CK8, CK10, and CK12.

The sixth to ninth flip-flops FF21 to FF24 of the second sampler 112B samples the first to fourth output signals Q11 to Q14 using the second to fifth output signals Q12 to Q15. Since the first to fourth output signals Q11 to Q14 are in a high state at the positive edges of the second to fifth output signals Q12 to Q15, the sixth to ninth output signals Q21 to Q24 are outputted at a high level. Therefore, the AND gate 113 outputs the harmonic lock signal HD at a high level to announce that the DLL 600 is in a normal lock state.

Figure 12:
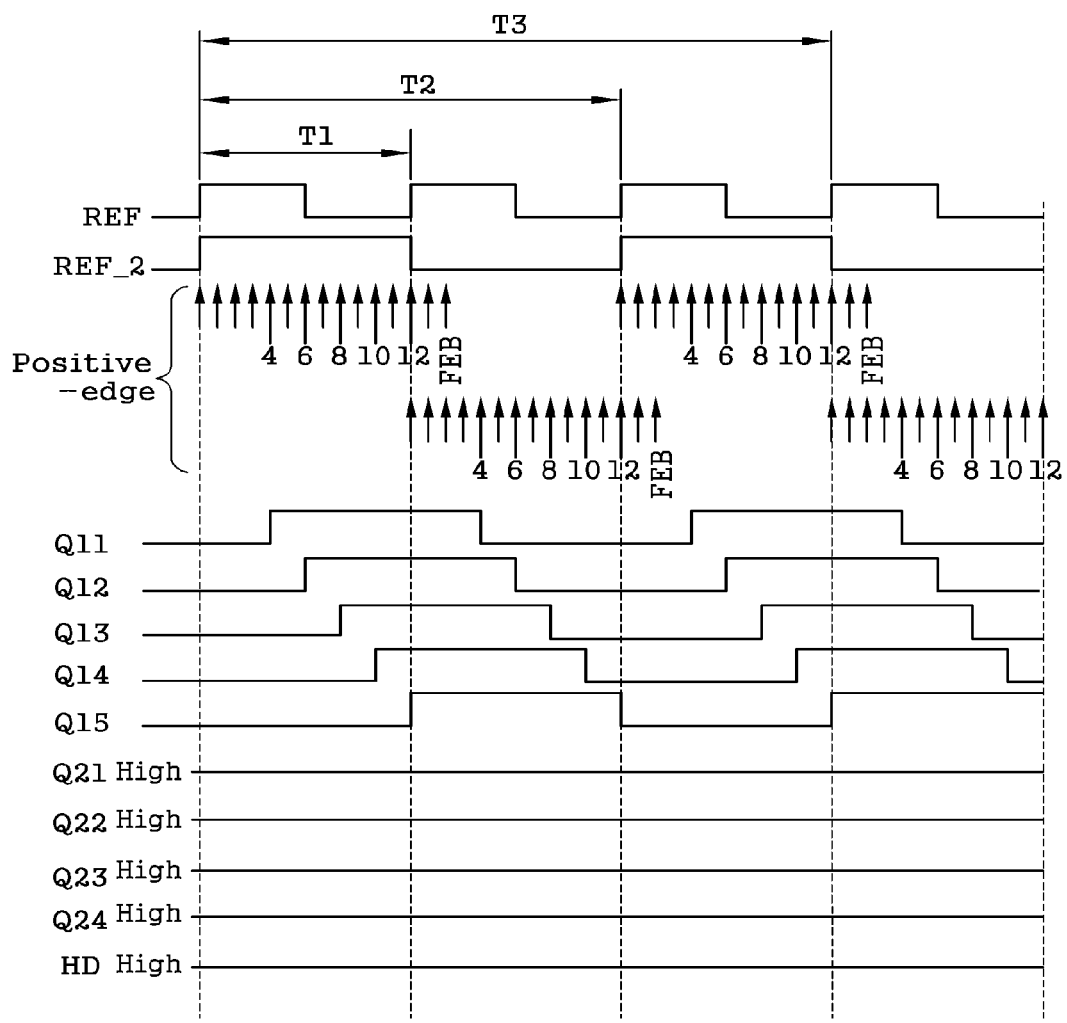
FIG. 12 is an operation timing diagram of the harmonic lock detector, indicating the maximum range in which the harmonic lock detector may detect a normal lock state.

FIG. 12 is an operation timing diagram of the harmonic lock detector, indicating the maximum range in which the harmonic lock detector may detect a normal lock state.

Referring to FIG. 12, the positive edge 12 of the 12th delayed clock signal CK12, of which the phase is the latest, among the positive edges of the clock signals CK4, CK6, CK8, CK10, and CK12 of the first to fifth flip-flops FF11 to FF15 is positioned at a point coinciding with a positive edge of the reference clock signal REF. Such a state indicates the maximum range in which the harmonic lock detector may detect a normal lock state. In this case, since all the positive edges of the clock signals CK4, CK6, CK8, CK10, and CK12 exist within each cycle period of the reference clock signal REF, the AND gate 113 of the harmonic lock detector 110 outputs the harmonic lock signal HD at a high level. Therefore, when delayed clock signals having different phases from the clock signals CK4, CK6, CK8, CK10, and CK12 among the delayed clock signals CK1 to CK14 are used as sampling clocks, the maximum range in which the harmonic lock detector 110 may detect a normal lock state may be changed.

Figure 13:
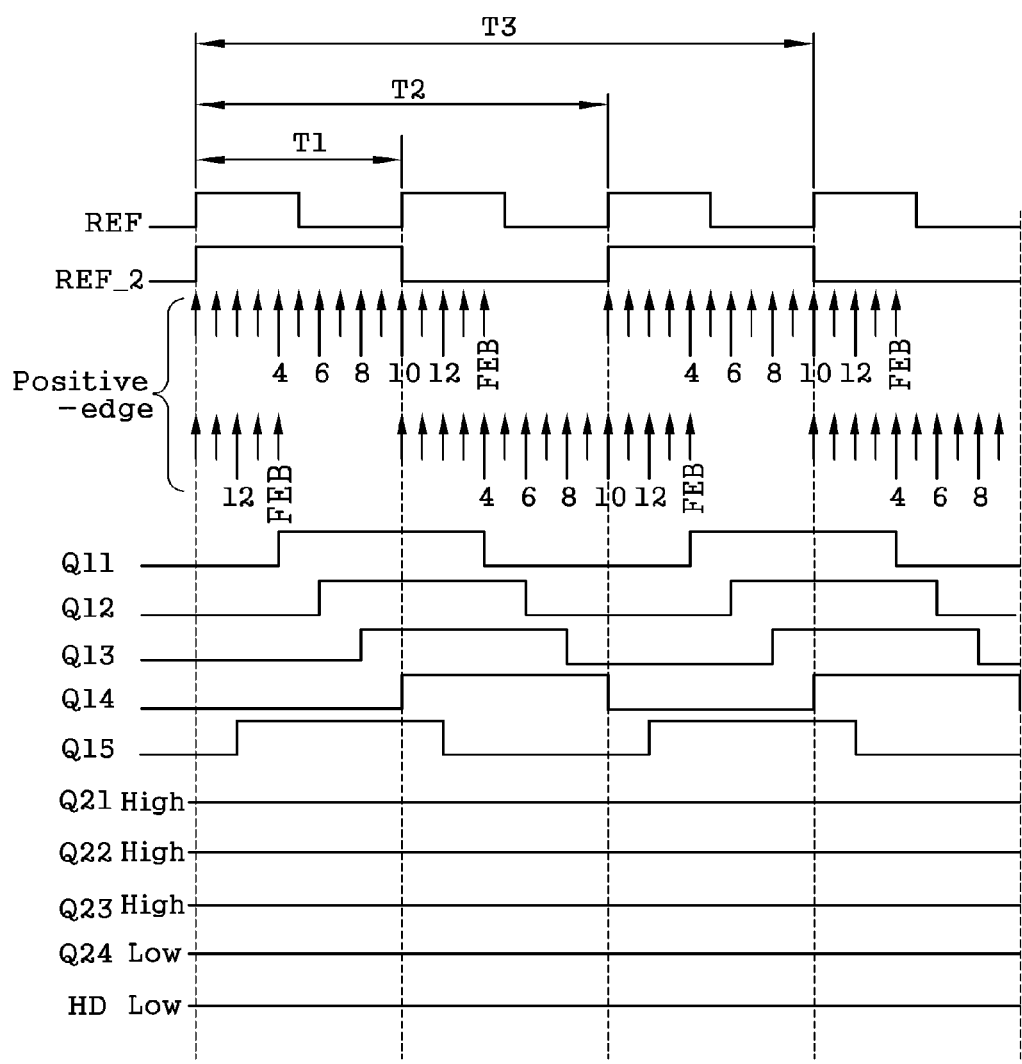
FIG. 13 is an operation timing diagram of the harmonic lock detector when it deviates from the maximum range in which the harmonic lock detector may detect a normal lock state.

FIG. 13 is an operation timing diagram of the harmonic lock detector when it deviates from the maximum range in which the harmonic lock detector may detect a normal lock state.

Referring to FIG. 13, it can be seen that the positive edge 12 of the 12th delayed clock signal CK12, of which the phase is the latest, among the positive edges of the clock signals CK4, CK6, CK8, CK10, and CK12 deviates from one cycle of the reference clock signal REF, but the positive edges of the second to tenth delayed clock signals CK2 to CK10 belong to one cycle of the reference clock signal REF.

Since all the positive edges of the clock signals CK4, CK6, CK8, CK10, and CK12 do not exist within each cycle of the reference clock signal REF, the AND gate 113 of the harmonic lock detector 110 activates the harmonic lock signal HD to a low level. This means that harmonic lock occurred. When the harmonic lock signal HD is outputted at a low level, the phase detector 200 of the DLL 600 operates in a direction to reduce the delay time of the VCDL 500, in order to remove the harmonic lock.

Such an operation will be described in more detail. When harmonic lock occurs as described above, the fifth flip-flop FF15 of the first sampler 112A samples the logic level of the divided-by-2 signal REF 2 at the positive edge of the 12th delayed clock signal CK12, and outputs the fifth output signal Q15.

The sixth to ninth flip-flops FF21 to FF24 of the second sampler 112B sample the first to fourth output signals Q11 to Q14 into the second to fifth output signals Q12 to Q15. Since the first to third output signals Q11 to Q13 are in a high state at the positive edges of the second to fourth output signals Q12 to Q14, the sixth to eighth flip-flops FF21 to FF23 output the sixth to eighth output signals Q21 to Q23 at a high level. On the other hand, since the fourth output signal Q14 is in a low state at the positive edge of the fifth output signal Q15, the ninth flip-flop FF24 outputs the ninth output signal Q24 at a low level. Therefore, the AND gate 113 of the harmonic lock detector 110 outputs the harmonic lock signal HD at a low level to announce that harmonic lock occurred.

Figure 14:
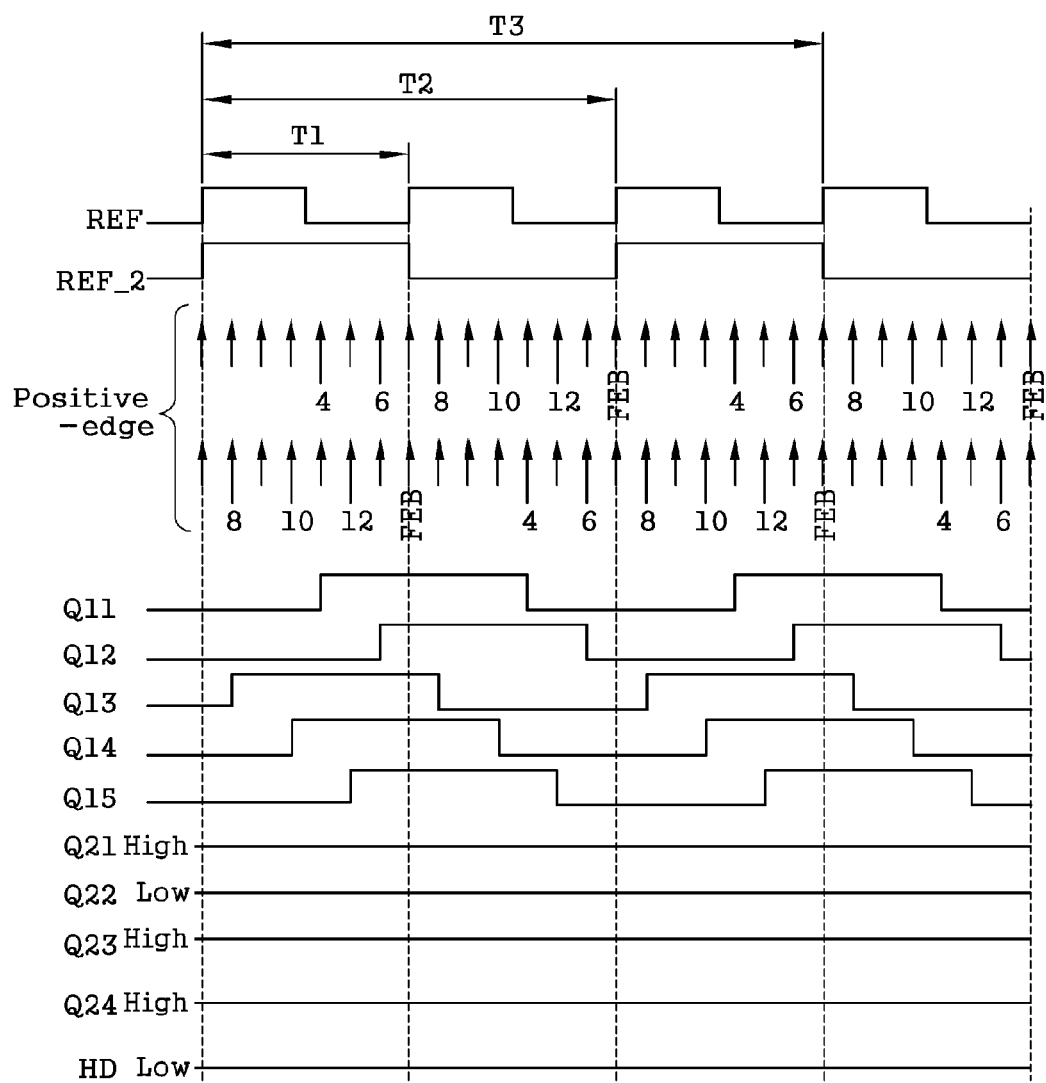
FIG. 14 is an operation timing diagram of the harmonic lock detector when a delay time of a feedback clock signal FEB outputted from the VCDL corresponds to two cycles of a reference clock signal.
Figure 15:
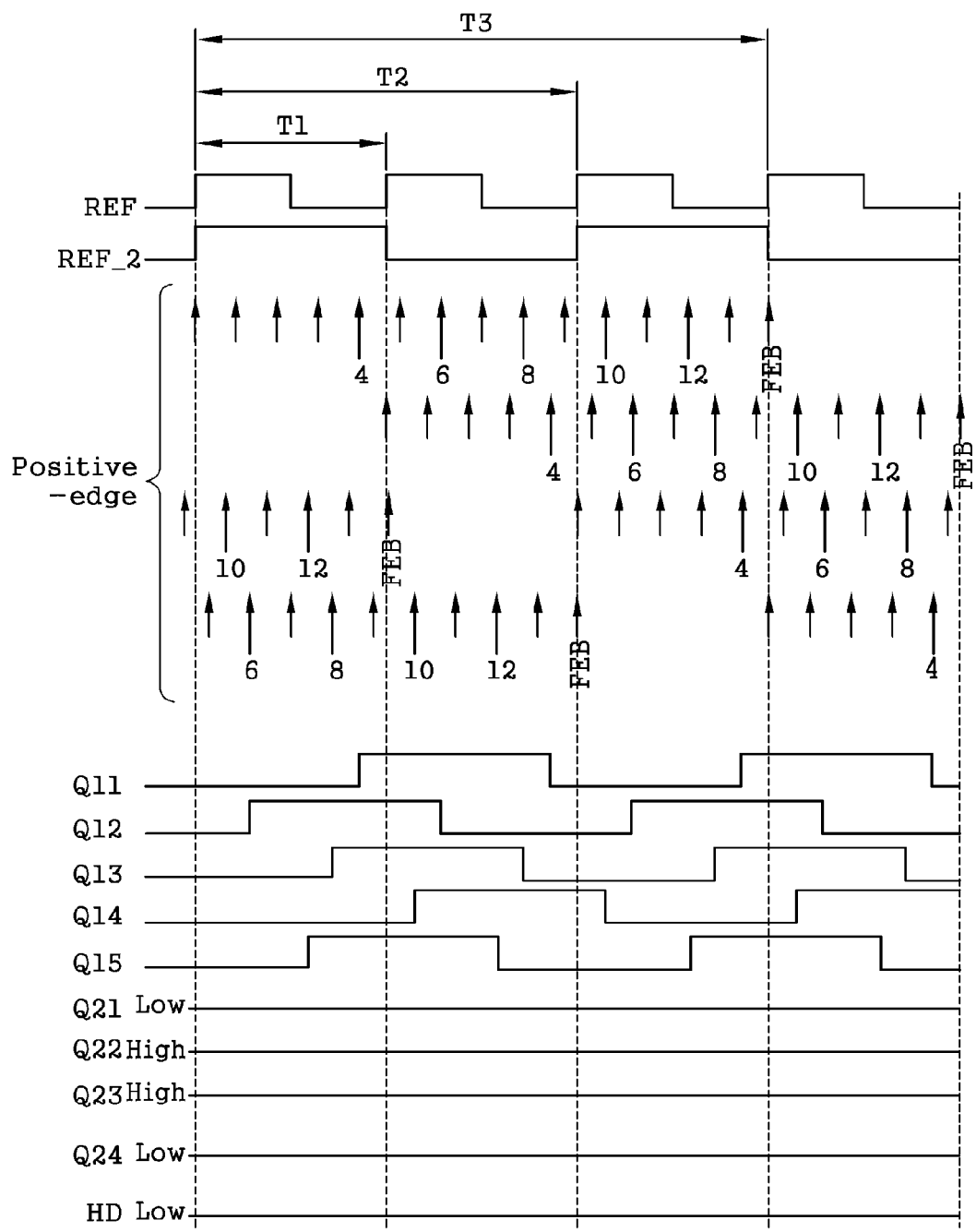
FIG. 15 is an operation timing diagram of the harmonic lock detector when the delay time of the feedback clock signal outputted from the VCDL corresponds to three cycles of the reference clock signal.

FIGS. 14 and 15 are operation timing diagrams of the harmonic lock detector 110 when the delay time of the feedback clock signal FEB outputted from the VCDL corresponds to two cycles and three cycles of the reference clock signal REF.

Referring to FIG. 14, when the delay time of the feedback clock signal FEB corresponds to two cycles of the reference clock signal REF, the seventh flip-flop FF22 of the second sampler 112B outputs a low signal according to the eighth delayed clock signal CK8 which is the first signal deviating from the one-cycle range of the reference clock signal REF. Accordingly, the AND gate 113 of the harmonic lock detector 110 outputs the harmonic lock signal HD at a low level to announce that a harmonic lock state occurred.

Referring to FIG. 15, when the delay time of the feedback clock signal FEB corresponds to three cycles of the reference clock signal REF, the sixth flip-flop FF21 of the second sampler 112B outputs a low signal Q21 according to the sixth delayed clock signal CK6 which is the first signal deviating from the one-cycle range of the reference clock signal REF. Accordingly, the AND gate 113 of the harmonic lock detector 110 outputs the harmonic lock signal HD at a low level to announce that a harmonic lock state occurred.

Figure 16:
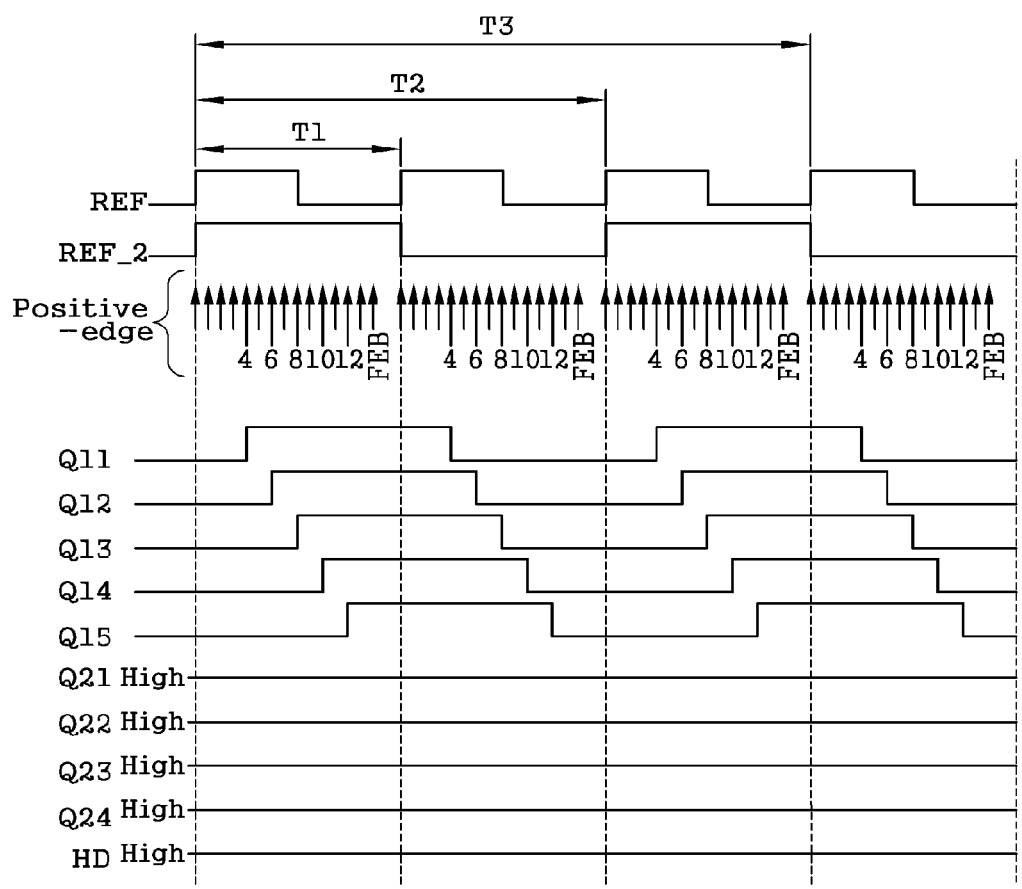
FIG. 16 is an operation timing diagram of the harmonic lock detector when the delay time of the feedback clock signal is smaller than one cycle of the reference clock signal.

FIG. 16 is an operation timing diagram of the harmonic lock detector when the delay time of the feedback clock signal FEB is smaller than one cycle of the reference clock signal REF.

Referring to FIG. 16, since all the positive edges of the delayed clocks CK1 to CK14 exist within one cycle of the reference clock signal REF, the harmonic lock detector 110 determines that the current state is a normal lock state, and outputs the harmonic lock signal HD at a high level.

However, although all the positive edges of the delayed clock signals CK1 to CK14 exist within one cycle of the reference clock signal REF and the delay time of the feedback clock signal FEB is smaller than one cycle of the reference clock signal REF, the phase detector 200 may generate a false phase difference signal, for example, the up signal UP. In this case, since the DLL 600 operates in a direction to reduce the delay time of the VCDL 500, a stuck lock state may occur.

Figure 17:
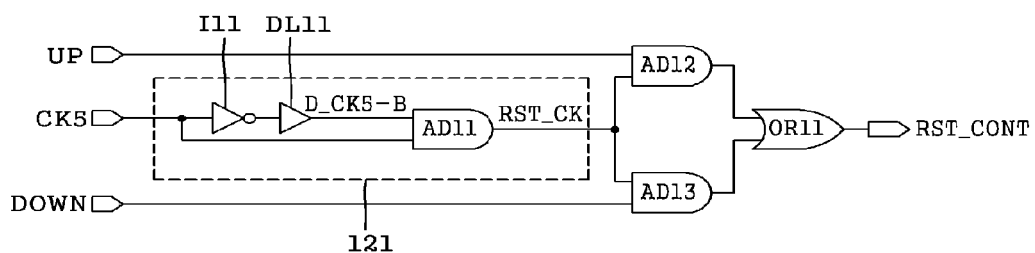
FIG. 17 is a circuit diagram of a stuck lock detector illustrated in FIG. 9.

Here, a case where a stuck lock state occurs will be described. FIG. 17 is a circuit diagram of the stuck lock detector illustrated in FIG. 9.

Referring to FIG. 17, the stuck lock detector 120 includes a positive edge detection unit 121, a second AND gate AD12, a third AND gate 13, and a first OR gate OR11. The positive edge detection unit 121 is configured to generate a positive edge detection signal RST_CK having a predetermined width based on the positive edge of the intermediate delayed clock signal CK5. The second AND gate AD12 is configured to perform an AND operation on the up signal UP and the positive edge detection signal RST_CK. The third AND gate AD13 is configured to perform an AND operation on the down signal DOWN and the positive edge detection signal RST_CK. The first OR gate OR11 is configured to perform an OR operation on an output of the second AND gate AD12 and an output of the third AND gate AD13.

The positive edge detection unit 121 includes a first inverter I11, a first delay DL11, and a first AND gate AD11. The first inverter I11 is configured to invert the phase of the intermediate delayed clock signal CK5. The first delay DL11 is configured to delay an output of the first inverter I11. The first AND gate AD11 is configured to perform an AND operation on an output D_CK5_B of the first delay DL11 and the intermediate delayed clock signal CK5 and output the operation result as the positive edge detection signal RST_CK. The predetermined width may be decided by the first delay DL11. In this embodiment of the present invention, the fifth delayed clock signal CK5 is used as the intermediate delayed clock signal, but the present invention is not limited thereto. Although any one of other delayed clock signals CK2 to CK4 and CK6 to CK13 having a larger delay time than the first delayed clock CK1 and a smaller delay time than the 14th delayed clock CK14 is used, it is possible to obtain the same effect.

Figure 18:
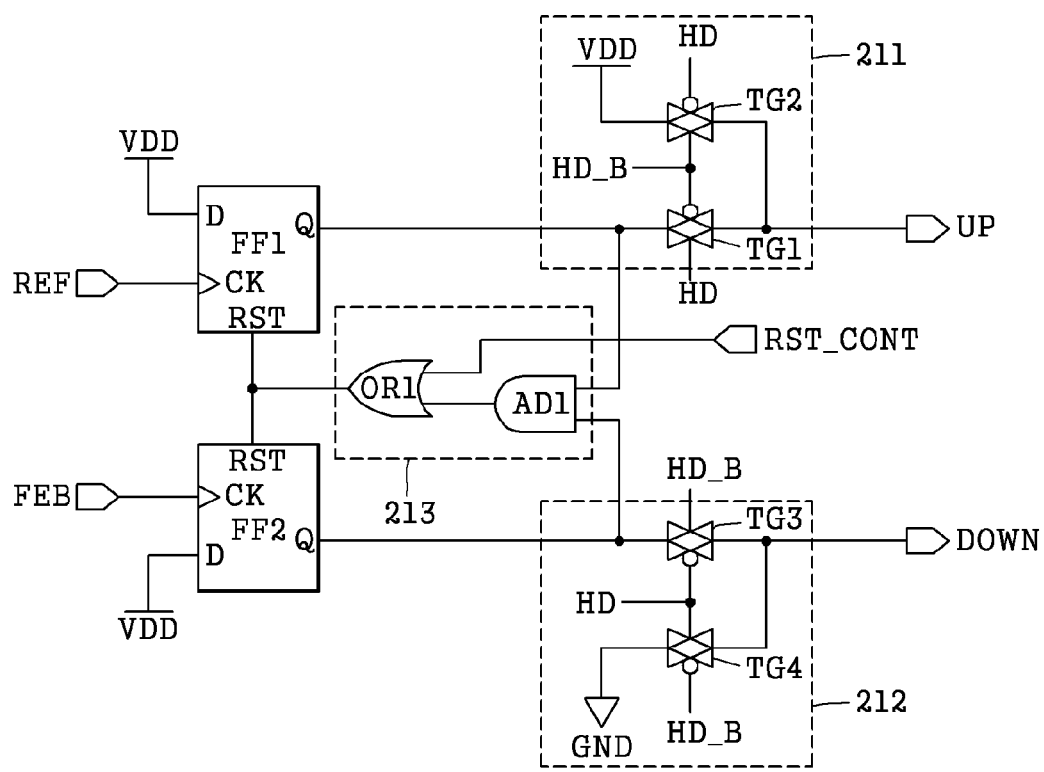
FIG. 18 is a block diagram of the phase detector illustrated in FIG. 8.

FIG. 18 is a block diagram of the phase detector illustrated in FIG. 8.

Referring to FIG. 18, the phase detector 200 includes a first flip-flop FF1, a second flip-flop FF2, an up signal output unit 211, a down signal output unit 212, and a reset control unit 213.

The first flip-flop FF1 has a data input terminal D connected to the power supply voltage VDD, a clock terminal CK connected to the reference clock signal REF, and an output terminal Q configured to generate the up signal UP as an output signal. The second flip-flop FF2 has a data input terminal D connected to the power supply voltage VDD, a clock terminal CK connected to the feedback clock signal FEB, and an output terminal Q configured to generate the down signal DOWN. When the phase of the reference clock signal REF leads the phase of the feedback clock signal FEB, the up signal UP is outputted from the first flip-flop FF1, and when the phase of the feedback clock signal FEB leads the phase of the reference clock signal REF, the down signal DOWN is outputted from the second flip-flop FF2.

The up signal output unit 211 includes a first switch TG1 and a second switch TG2. The first switch TG1 is positioned between the output terminal Q of the first flip-flop FF1 and an up signal output terminal, and configured to control an output of the up signal UP in response to a harmonic lock signal pair HD and HD_B. The second switch TG2 is positioned between the power supply voltage VDD and the up signal output terminal and configured to control an output of the power supply voltage VDD in response to the harmonic lock signal HD_B and HD. The first and second switches TG1 and TG2 may operate complementarily with each other in response to the harmonic lock signal pair HD and HD_B.

The down signal output unit 212 includes a third switch TG3 and a fourth switch TG4. The third switch TG3 is positioned between the output terminal Q of the second flip-flop FF2 and a down signal output terminal, and configured to control an output of the down signal DOWN in response to the harmonic lock signal pair HD and HD_B. The fourth switch TG4 is positioned between the ground GND and the down signal output terminal, and configured to control the connection between the ground GND and the down signal output terminal in response to the harmonic lock signal pair HD_B and HD. The third and fourth switches TG3 and TG4 may operate complementarily with each other in response to the harmonic lock signal pair HD and HD_B.

The reset control unit 213 includes an AND gate AD1 and an OR gate OR1. The AND gate AD1 is configured to perform an AND operation on signals outputted from the output terminals Q of the first and second flip-flops FF1 and FF2, and the OR gate OR1 is configured to perform an OR operation on the stuck lock signal RST_CONST and an output of the AND gate AD1.

When the delay time of the VCDL 500 exists in the maximum range in which a normal lock state may be detected, the harmonic lock detector 110 of the false lock prevention circuit 100 supplies the harmonic lock signal HD at a high level to the phase detector 200. Therefore, the power supply voltage VDD is blocked by the second switch TG2 of the up signal output unit 211 and not outputted as the up signal UP, and the ground voltage GND is blocked by the fourth switch TG4 of the down signal output unit 212 and not outputted as the down signal DOWN. The up signal UP outputted from the first flip-flop FF1 is outputted toward the charge pump 300 through the first switch TG1 of the up signal output unit 211, and the down signal DOWN outputted from the second flip-flop FF2 is outputted toward the charge pump 300 through the third switch TG3 of the down signal output unit 212.

When the harmonic lock signal HD is activated to a low level and supplied to the phase detector 200, it means that the delay time of the feedback clock signal FEB exceeds one cycle of the reference clock signal REF or a harmonic lock state occurred. Therefore, the phase detector 200 may increase the level of the control voltage Vctrl to reduce the delay time. For this operation, the up signal output unit 211 outputs the power supply voltage VDD as the up signal UP through the second switch TG2, and the down signal output unit 212 outputs the ground voltage GND as the down signal DOWN through the fourth switch TG4. Accordingly, as the delay time of the reference clock signal REF in the VCDL 500 rapidly decreases, it is possible to prevent a harmonic lock state.

Meanwhile, when the delay time of the VCDL 500 exists in the maximum range in which the harmonic lock detector 110 of the false lock prevention circuit 100 may detect a normal lock state, the harmonic lock detector 110 inside the false lock prevention circuit 100 does not supply the activated reset signal RST_CONST to the phase detector 200. Accordingly, the first and second flip-flops FF1 and FF2 of the phase detector 200 are reset only by an output signal based on an operation result of the up signal UP and the down signal DOWN by the reset control unit 213. However, when the harmonic lock detector 110 of the false lock prevention circuit 100 supplies the stuck lock signal RST_CONST to the phase detector 200, the first and second flip-flops FF1 and FF2 are reset by the reset control unit 213. Immediately, the entire phase detector 200 is reset.

Figure 19:
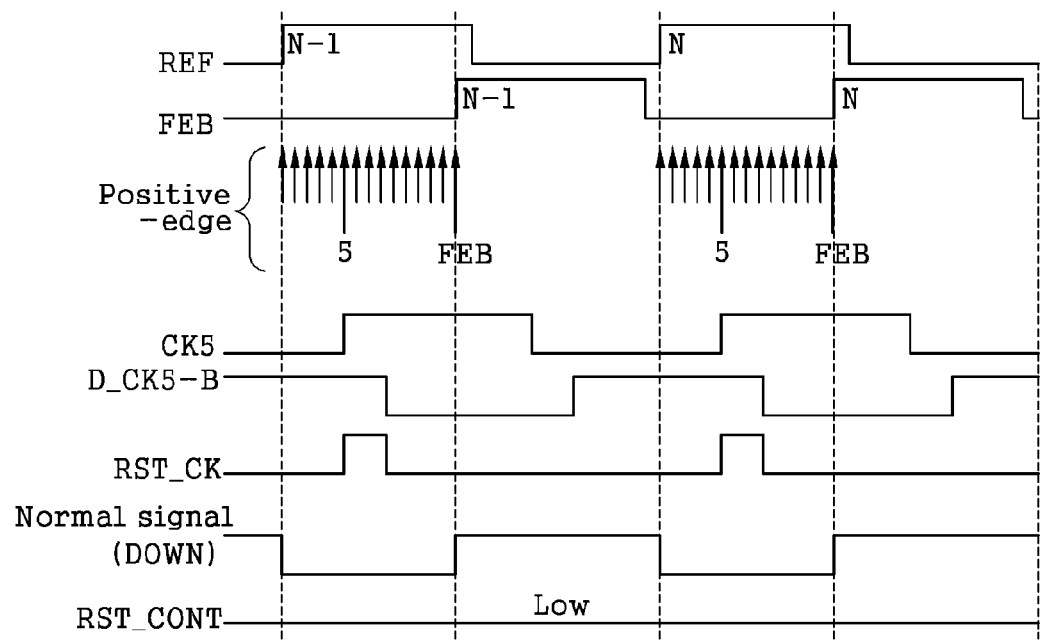
FIG. 19 is an operation timing diagram of the phase detector and the stuck lock detector when the delay time of the VCDL is smaller than 0.5 cycle of the reference clock signal and the reference clock signal and the feedback clock signal are correctly compared.

FIG. 19 is an operation timing diagram of the phase detector and the stuck lock detector when the delay time of the VCDL is smaller than 0.5 cycle of the reference clock signal and the reference clock signal and the feedback clock signal are correctly compared.

Referring to FIG. 19, since the phase of an (N−1)-th positive edge of the feedback clock signal FEB leads the phase of the N-th positive edge of the reference clock signal REF, the phase detector 200 activates the down signal DOWN to a high level during a period corresponding to the phase difference, and outputs an instant pulse, which is synchronized with a negative edge at which the down signal DOWN transits to a low level, as the up signal UP (not illustrated). Here, the phase difference indicates a delay amount to be increased for a normal lock state.

The DLL according to the embodiment of the present invention is designed to reduce the delay time of the VCDL 500 as the control voltage Vctrl increases. Therefore, a normal signal is the down signal DOWN. When the down signal DOWN transits from a high level to a level, the up signal UP transits from a low level to a high level and then transits to a low level for a very short time. At this time, the time at which the down signal DOWN transits from a high level to a low level coincides with the time at which the up signal UP transits from a high level to a low level. The high period of the up signal UP is a very short time required to reset the flip-flop of the phase detector 200.

Since all of the sampling clocks CK1 to CK14 exist within one cycle of the reference clock signal REF, the harmonic lock detector 110 outputs the harmonic lock signal HD at a high level to announce that the current state is not a harmonic lock state. The positive edge detection unit 121 of the stuck lock detector 120 performs an AND operation on the intermediate delayed clock signal CK5 and the signal D_CK5_B obtained by inverting and delaying the intermediate delayed clock signal CK5, and generates the positive edge detection signal RST_CK. The positive edge detection signal RST_CK is generated within the time delayed by the VCDL 500.

The OR gate OR1 of the stuck lock detector 120 activates the stuck lock signal RST_CONT to a high level when a period in which the positive edge detection signal RST_CK and the down signal DOWN are simultaneously at a high level occurs. In this embodiment of the present invention, since the high periods of the down signal DOWN and the positive edge detection signal RST_CK do not overlap each other, the stuck lock signal RST_CONT maintains a low state. In this case, the phase detector 200 is reset by an AND operation on the down signal DOWN and the up signal UP which the first flip-flop FF1 instantly generates at a positive edge of the reference clock signal REF.

Figure 20:
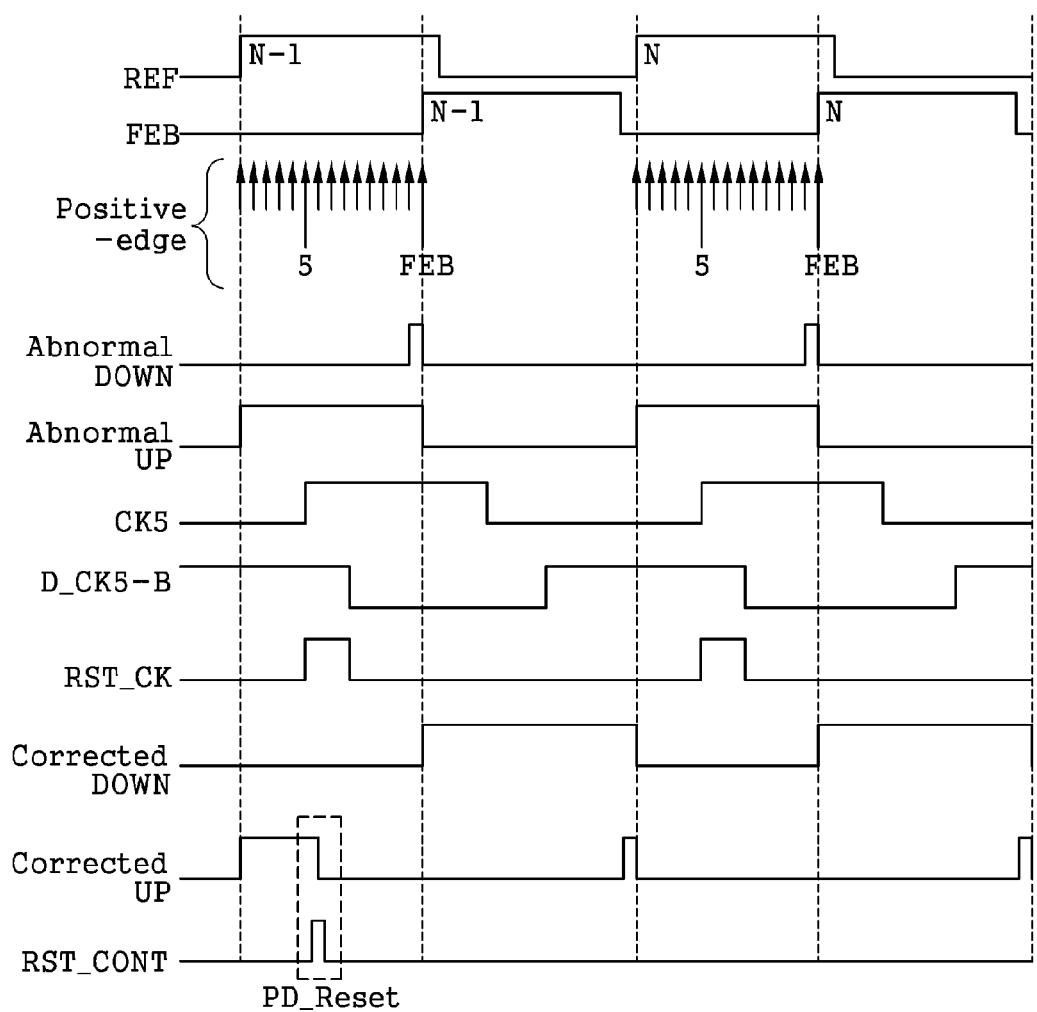
FIG. 20 is an operation timing diagram of the phase detector and the stuck lock detector when the delay time of the VCDL is smaller than 0.5 cycle of the reference clock signal and the reference clock signal and the feedback clock signal are falsely compared.

FIG. 20 is an operation timing diagram of the phase detector and the stuck lock detector when the delay time of the VCDL is smaller than 0.5 cycle of the reference clock signal and the reference clock signal and the feedback clock signal are falsely compared.

Referring to FIG. 20, when the phase detector 200 compares an (N−1)-th positive edge of the reference clock signal REF to an (N−1)-th positive edge of the feedback clock signal FEB because of a certain reason, for example, an initial value error, the phase detector 200 determines that the phase difference therebetween corresponds to such a level as to reduce the delay time of the VCDL 500, because the phase of the (N−1)-th positive edge of the reference clock signal REF leads the phase of the (N−1)-th positive edge of the feedback clock signal FEB.

Therefore, the phase detector 200 generates an abnormal up signal Abnormal UP to increase the control voltage Vctrl, and the DLL operates in a direction to reduce the phase difference between the (N−1)-th positive edge of the reference clock signal REF and the (N−1)-th positive edge of the feedback clock signal FEB in response to the control voltage Vctrl. A period in which the abnormal up signal Abnormal UP is high is a delay time which is recognized as a phase difference to be reduced by the phase detector 200. An abnormal down signal Abnormal DOWN is generated by a positive edge of the feedback clock signal FEB after the delay time passes.

Here, the abnormal up signal Abnormal UP means an up signal in a false lock state, and is not generated in a normal lock state. Furthermore, an abnormal down signal Abnormal DOWN means a down signal in a false lock state, and has the same meaning in the following descriptions.

When the stuck lock detector 120 according to the embodiment of the present invention does not exist as in the conventional DLL, the phase detector 120 compares an N-th positive edge of the reference clock signal REF to an N-th positive edge of the feedback clock signal FEB once again, the DLL 600 continuously operates in a direction to reduce the delay time of the VCDL 500 and thus does not escape from the stuck lock state.

However, when the stuck lock detector 120 according to the embodiment of the present invention is provided, the positive edge detection unit 121 of the stuck lock detector 120 generates the positive edge detection signal RST_CK within the delay time of the VCDL 500. The stuck lock detector 120 outputs the stuck lock signal RST_CONT activated in a period where the high states of the abnormal up signal Abnormal UP and the positive edge detection signal RST_CK overlap each other, through an AND operation. The stuck lock signal RST_CONT resets the first and second flip-flops FF1 and FF2 of the phase detector 200 through the OR gate OR1 of the reset control unit 213 such that the abnormal up signal Abnormal UP is corrected into the normal up signal Normal UP.

Then, since the phase detector 200 reset by the stuck lock signal RST_CONT compares the (N−1)-th positive edge of the feedback clock signal FEB to the N-th positive edge of the reference clock signal REF, the phase detector 200 generates a corrected down signal Corrected DOWN and a corrected up signal Corrected UP to operate the DLL 600 in a direction to increase the delay time of the VCDL 500, and the DLL 600 returns to a normal lock state.

Therefore, although the phase detector 200 generates the abnormal UP signal Abnormal UP by comparing the (N−1)-th positive edge of the reference clock signal REF to the (N−1)-th positive edge of the feedback clock signal FEB because of a certain reason, the phase detector 200 may be reset by the reset signal RST_CONT generated by the stuck lock detector 120, and then correctly compare the N-the positive edge of the reference clock signal REF to the (N−1)-th positive edge of the feedback clock signal FEB. Accordingly, a stuck lock state may be prevented from occurring in the DLL 600, and the reference clock signal REF and the feedback clock signal FEB may be synchronized by delaying the reference clock signal REF by one cycle.

Figure 21:
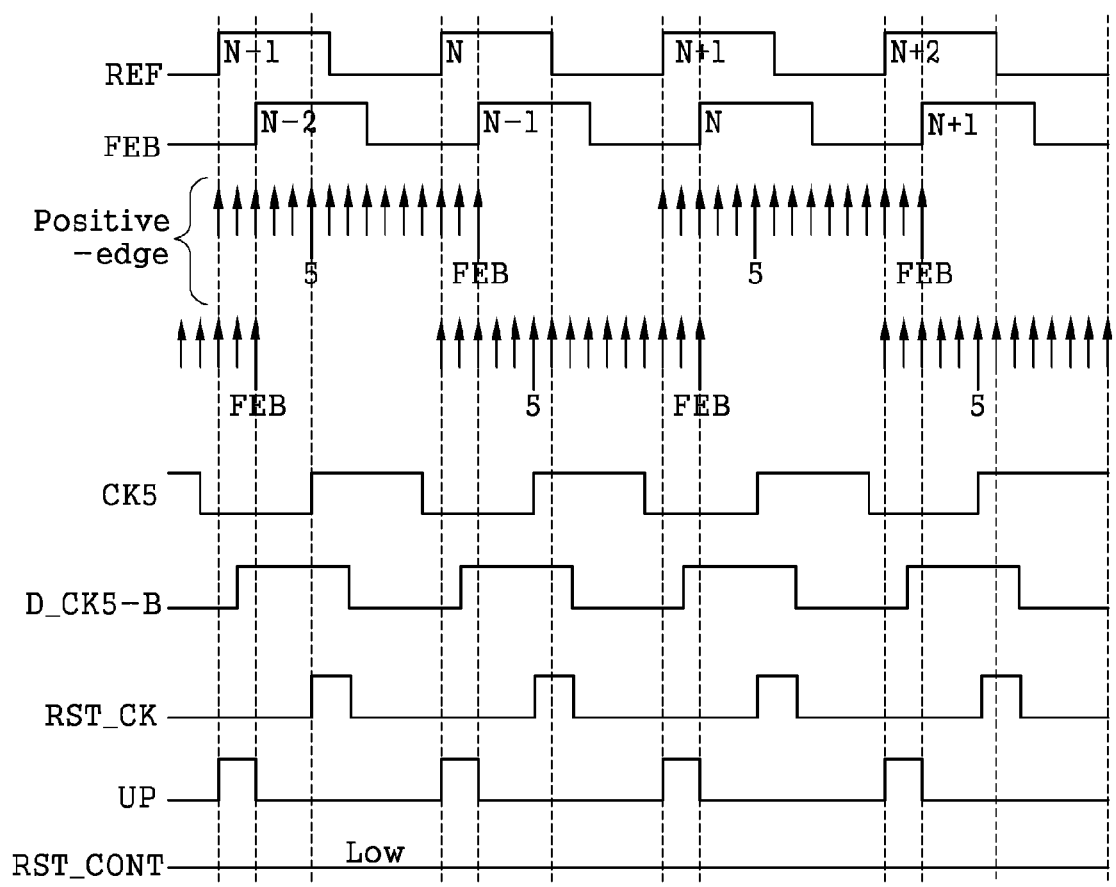
FIG. 21 is an operation timing diagram of the phase detector and the stuck lock detector when the reference clock signal and the feedback clock signal are correctly compared in the maximum range in which a normal lock state may be detected.

FIG. 21 is an operation timing diagram of the phase detector and the stuck lock detector when the reference clock signal and the feedback clock signal are correctly compared in the maximum range in which a normal lock state may be detected.

Referring to FIG. 21, since the phase of an N-th positive edge of the reference clock signal REF leads the phase of an (N−1)-th positive edge of the feedback clock signal FEB, the phase detector 200 generates the up signal UP and operates in a direction to reduce the delay time of the VCDL 500 according to the control voltage Vctrl. A high period of the up signal UP corresponds to a delay amount which the VCDL 500 is to reduce. The positive edge detection unit 121 of the stuck lock detector 120 generates the positive edge detection signal RST_CK within the delay time of the VCDL 500.

When the phase detector 200 correctly compares the reference clock signal REF and the feedback clock signal FEB in the maximum range in which the harmonic lock detector 110 may detect a normal lock state, the stuck lock detector 120 does not activate the stuck lock signal RST_CONT, because a period in which the high states of the positive edge detection signal RST_CK and the up signal UP overlap each other does not exists.

Therefore, the phase detector 200 is not reset by the stuck lock signal RST_CONT, but normally operates in a direction to reduce the phase difference between the reference clock signal REF and the feedback clock signal FEB.

Figure 22:
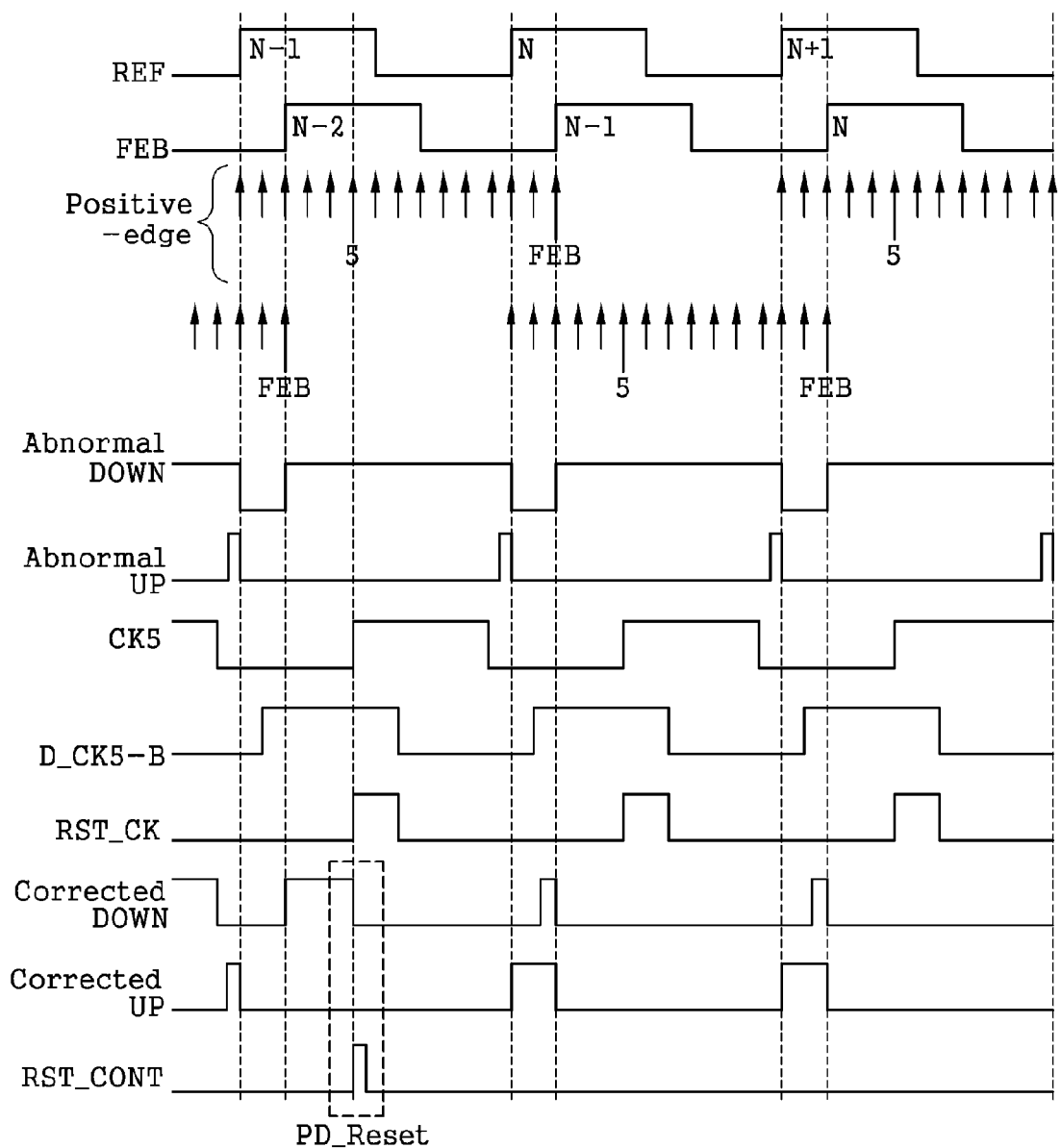
FIG. 22 is an operation timing diagram of the phase detector and the stuck lock detector when the reference clock signal and the feedback clock signal are falsely compared in the maximum range in which a normal lock state may be detected.

FIG. 22 is an operation timing diagram of the phase detector and the stuck lock detector when the reference clock signal and the feedback clock signal are falsely compared in the maximum range in which a normal lock state may be detected.

Referring to FIG. 22, since the phase of the reference clock signal REF leads the phase of the feedback clock signal FEB by a period between an N-th positive edge of the reference clock signal REF and an (N−1)-th positive sedge of the feedback clock signal FEB, the delay amount of the feedback clock FEB must be reduced to synchronize the reference clock signal REF and the feedback clock FEB.

However, when the phase detector 200 compares an N-th positive edge of the reference clock signal REF to an (N−2)-th positive edge of the feedback clock FEB because of a certain reason, for example, an initial value error, the phase detector 200 determines to increase the delay amount of the feedback clock signal FEB such that the reference clock signal REF and the feedback clock signal FEB are synchronized, because the phase of the feedback clock signal FEB leads the phase of the reference clock signal REF by a period between the (N−2)-th positive edge of the feedback clock signal FEB and the N-th positive edge of the reference clock signal REF. Then, the phase detector 200 outputs an abnormal down signal Abnormal DOWN.

In the conventional DLL where the stuck lock detector 120 according to the embodiment of the present invention does not exist, the phase detector 200 continuously compares an (N+1)-th positive edge of the reference clock signal REF and an (N−1)-th positive edge of the feedback clock signal FEB, and then compares an (N+2)-th positive edge of the reference clock signal REF and an N-th positive edge of the feedback clock signal FEB. Therefore, the DLL 500 does not escape from the stuck lock state.

When the stuck lock detector 120 according to the embodiment of the present invention is provided, the positive edge detection unit 121 of the stuck lock detector 120 generates the positive edge detection signal RST_CK within the delay time of the VCDL 500. The stuck lock detector 120 performs an AND operation on the positive edge detection signal RST_CK and the abnormal down signal Abnormal DOWN, and outputs the stuck lock signal RST_CONT which is activated in a period where the high states of the abnormal down signal Abnormal DOWN and the positive edge detection signal RST_CK overlap each other. The stuck lock signal RST_CONT resets the first and second flip-flops FF1 and FF2 of the phase detector 200 through the OR gate OR1 of the reset control unit 213, and corrects the abnormal down signal Abnormal DOWN into a normal down signal Normal DOWN.

Then, since the phase detector 200 reset by the stuck lock signal RST_CONT compares the (N−1)-th positive edge of the feedback clock signal FEB to the N-th positive edge of the reference clock REF, the phase detector 200 generates a normal down signal Corrected DOWN to operate the DLL 600 in a direction to reduce the delay time of the VCDL 500.

Therefore, even when the phase detector 200 compares the N-th positive edge of the reference clock REF to the (N−2)-th positive edge of the feedback clock signal FEB, a stuck lock state may be prevented from occurring, and the reference clock signal REF and the feedback clock signal FEB may be synchronized by delaying the reference clock signal REF by one cycle.

The DLL 600 according to the embodiment of the present invention may become in any one of the following two states.

First, when the false lock prevention circuit 100 outputs both of the harmonic lock signal HD and the stuck lock signal RST_CONT at a high level, the phase detector 200 may be reset by the stuck lock signal RST_CONT, not only when comparing the phases of the (N−1)-th positive edge of the reference clock signal REF and the (N−1)-th positive edge of the feedback clock signal FEB as shown in FIG. 20, but also when comparing the phases of the N-th positive edge of the reference clock signal REF and the (N−2)-th positive edge of the feedback clock signal FEB as shown in FIG. 22. Since the phase detector 200 was reset by the stuck lock signal RST_CONT, the phase detector 200 may normally compare the N-th positive edge of the reference clock signal REF to the (N−1)-th positive edge of the feedback clock signal FEB. That is, the phase detector 200 correctly compares the phases of the reference clock signal REF and the feedback clock signal FEB such that the DLL 600 becomes in a normal lock state.

Second, when the false lock prevention circuit 100 outputs the harmonic lock signal HD at a high level and outputs the stuck lock signal RST_CONT at a low level, the DLL 600 becomes in a normal state according to the operation of the phase detector 200, because the phase detector 200 correctly compares the phases of the reference clock signal REF and the feedback clock signal FEB.

Figure 23:
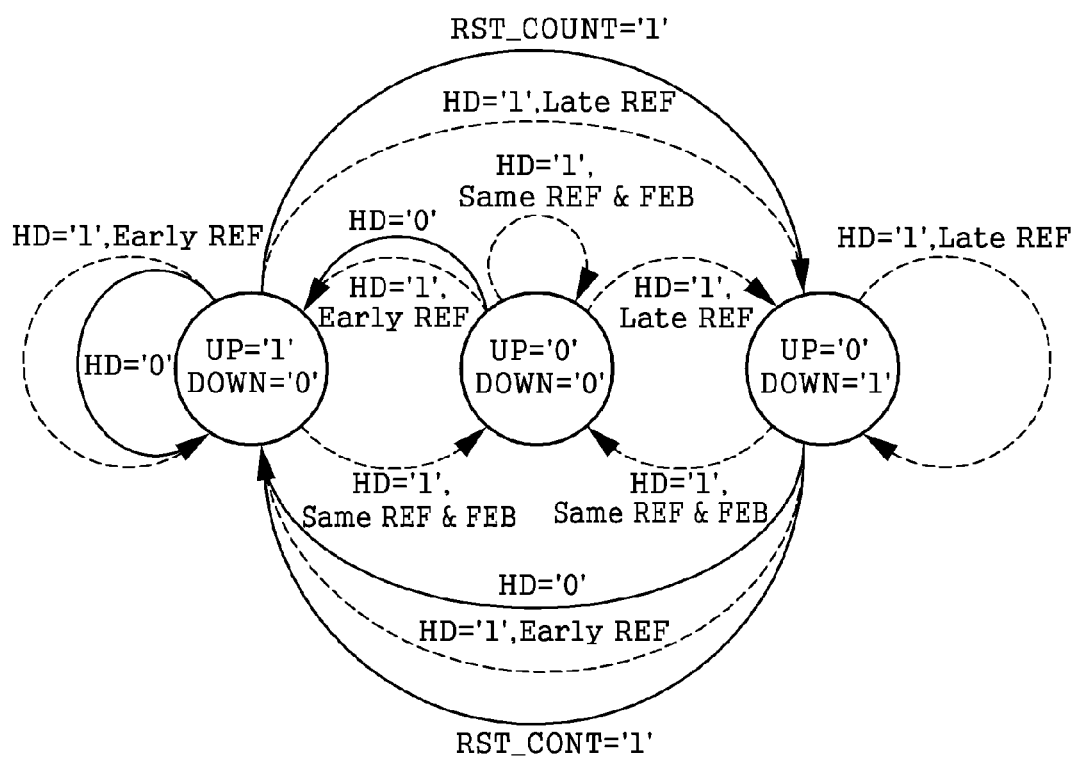
FIG. 23 is a state diagram of the phase detector illustrated in FIG. 8.

FIG. 23 is a state diagram of the phase detector illustrated in FIG. 8.

Referring to FIG. 23, the phase detector 200 according to the embodiment of the present invention includes the logic that when the harmonic lock signal HD is '0' (logic low), the up signal UP becomes '1' (logic high) and the down signal becomes '0' (logic low), regardless of in which state the DLL 600 is. Therefore, the DLL 600 according to the embodiment of the present invention may operate in a direction to reduce the delay time of the VCDL 500, in order to synchronize the phases of the reference clock signal REF and the feedback clock signal FEB in a harmonic lock state.

When the harmonic lock signal HD is '1' and the phase of the reference clock signal REF leads the phase of the feedback clock signal FEB, the up signal UP becomes '1', and the down signal DOWN becomes '0'. Furthermore, when the harmonic lock signal HD is '1' and the phase of the reference clock signal REF lags behind the phase of the feedback clock signal FEB, the up signal UP becomes '0', and the down signal DOWN becomes '1'. Furthermore, when the harmonic lock signal HD is '1' and the phase of the reference clock REF is identical to the phase of the feedback clock FEB, the up signal UP becomes '0', and the down signal DOWN also becomes '0'.

When the reset signal RST_CONT becomes '1' in a state where the up signal UP is '1' and the down signal DOWN is '0' or the up signal UP is '0' and the down signal DOWN is '1', it indicates that the phase detector 200 falsely compared the phases of the reference clock signal REF and the feedback clock signal FEB. The phase detector 200 according to the embodiment of the present invention includes the logic that when the phase detector 200 falsely compares the reference clock signal REF and the feedback clock signal FEB because of a certain reason such that the DLL may fall in a stuck lock state, it may be corrected by the stuck lock signal RST_CONT.

Therefore, when the reset signal RST_CONT becomes '1' in a state where the up signal UP is '1' and the down signal DOWN is '0', the up signal UP is corrected into '0' and the down signal DOWN is corrected into '1', and when the reset signal RST_CONT becomes '1' in a state where the up signal UP is '0' and the down signal DOWN is '1', the up signal UP is corrected into '1' and the down signal DOWN is corrected into '0'. Accordingly, the phases of the reference clock signal REF and the feedback clock signal FEB may be synchronized with each other.

The lock state indicates a state in which the harmonic lock signal HD is '1' and a phase difference between the reference clock signal REF and the feedback clock signal FEB is maintained at '0' in a state where both of the up signal UP and the down signal DOWN are '0'.

The delay range VCDL_delay of the VCDL 500 in the DLL 600 to which the false lock prevention circuit 100 according to the embodiment of the present invention is applied is set to 0<VCDL_delay<2*T*N. Here, N represents the number of delay elements DL1 to DLn of the VCDL 500. Therefore, when the VCDL 500 uses 14 delay elements as illustrated in FIG. 8, the delay range VCDL_delay of the VCDL 500 is set to 0<VCDL_delay<28*T.

Furthermore, the harmonic lock detector 110 and the stuck lock detector 120 of the false lock prevention circuit 100 according to the embodiment of the present invention detect a harmonic lock state and a stuck lock state using the positive edges of the first to 14th delayed clock signals CK1 to CK14 generated by the VCDL 500. Therefore, the DLL 600 may operate without receiving an effect of the duty rate of the reference clock signal.

In this embodiment of the present invention, the VCDL 500 has the minimum delay time when the control voltage Vctrl is the power supply voltage VDD, and the delay time of the VCDL 500 increases when the control voltage Vctrl gradually decreases according to the down signal DOWN. However, the present invention is not limited to the structure. For example, the VCDL 500 may have the minimum delay time when the control voltage Vctrl is the ground voltage VSS, and the delay time of the VCDL 500 may increase when the control voltage Vctrl gradually increases according to the up signal UP. The configuration and operation of the VCDL 500 which has the minimum delay time when the control voltage Vctrl is the ground voltage VSS may be easily understood by those skilled in the art from the description where the VCDL 500 has the minimum delay time when the control voltage Vctrl is the power supply voltage VDD. Therefore, the detailed descriptions thereof are omitted herein.

In this embodiment of the present invention, it has been described that the VCDL 500 has 14 delay elements and includes 14 delayed clocks corresponding to the respective delay elements. However, the present invention is not limited thereto, but the VCDL 500 may have a different number of delay elements depending on an applied system.

Although a preferred embodiment of the present invention has been described for illustrative purposes, those skilled in the art will appreciate that various modifications, additions and substitutions are possible, without departing from the scope and the spirit of the invention as disclosed in the accompanying claims.

The invention claimed is:

1. A false lock prevention circuit comprising:
  a detector configured to:
    receive a reference clock signal;
    receive a plurality of clock signals delayed from the reference clock signal; and
    detect that at least a part of the plurality of delayed clock signals deviates from one cycle of the reference clock signal,
  wherein, when one or more of transition edges of the delayed clock signals do not exist within one cycle of the reference clock signal, the detector is configured to announce that a false lock has occurred,
  wherein the detector comprises:
    a divider configured to divide the reference clock signal;
    a first sampler configured to sample an output signal of the divider using a part or all of the plurality of delayed clock signals;
    a second sampler configured to sample output signals of the first sampler; and
    a logic unit configured to perform a logic operation on output signals of the second sampler.

2. The false lock prevention circuit of claim 1, wherein each of the first and second samplers comprises a plurality of flip-flops.

3. A delay locked loop (DLL) configured to synchronize a reference clock signal with a feedback clock signal delayed by a predetermined time from the reference clock signal, the DLL comprising:
  a false lock prevention circuit configured to divide the reference clock signal, sample the divided clock signal a plurality of times using a plurality of delayed clock signals, perform a logic operation on the sampling results, and generate a harmonic lock signal;
  a phase detector configured to generate an up signal and a down signal such that a phase difference between the reference clock signal and the feedback clock signal decreases when the harmonic lock signal is activated and inputted, and be reset to detect the phase difference between the reference clock signal and the feedback clock signal when a stuck lock signal is activated and inputted;
  a charge pump configured to source or sink a current in response to the up signal or the down signal;

a low-pass filter configured to generate a control voltage corresponding to the current; and
a voltage controlled delay line (VCDL) configured to generate a plurality of delayed clock signals among which a delay time interval is increased or reduced according to change of the control voltage.

4. The DLL of claim 3, wherein the phase detector is configured to generate a signal to reduce the delay time interval when the phase of the reference clock signal leads the phase of the feedback clock signal by one cycle or more, and to generate a signal to increase the delay time interval when the phase of the reference clock signal lags behind the phase of the feedback clock signal by one cycle or less.

5. The DLL of claim 3, wherein the false lock prevention circuit further comprises a stuck lock detector configured to generate a positive edge detection signal using one of the plurality of delayed clock signals, and to generate a stuck lock signal by performing a logic operation on the positive edge detection signal and the up signal or the down signal.

6. The DLL of claim 3, wherein the false lock prevention circuit comprises:
a first false lock detector configured to sample the divided clock signal based on the reference clock signal using the plurality of delayed clock signals, and to perform a logic operation; and
a second false lock detector configured to perform a different logic operation using the up signal or the down signal and a part of the plurality of delayed clock signals.

7. The DLL of claim 3, wherein the false lock prevention circuit is configured to detect that a delay time of the feedback clock signal exceeds one cycle of the reference clock signal.

8. The DLL of claim 3, wherein the false lock prevention circuit comprises:
a divider configured to divide the reference clock signal;
a first sampler configured to sample an output signal of the divider using a part or all of the plurality of delayed clock signals;
a second sampler configured to sample output signals of the first sampler; and
a logic unit configured to perform a logic operation on output signals of the second sampler.

9. The DLL of claim 3, wherein, when detecting a harmonic lock state, the phase detector is configured to continuously reduce a delay time of the feedback clock signal until the DLL escapes from the harmonic lock state.

10. The DLL of claim 3, wherein the phase detector comprises:
a first flip-flop configured to receive the reference clock signal;
a second flip-flop configured to receive the feedback clock signal;
an up signal output unit configured to output the up signal;
a down signal output unit configured to output the down signal;
a reset control unit connected to reset terminals of the first and second flip-flops.

11. The DLL of claim 10, wherein the up signal output unit is configured to select one of a first path connected to a fixed voltage and a second path connected to an output of the first flip-flop, and
the down signal output unit is configured to select one of a third path connected to another fixed voltage and a fourth path connected to an output of the second flip-flop.

12. The DLL of claim 11, wherein the up signal output unit is configured to select the first path when the DLL is in a harmonic lock state, and to select the second path when the DLL is not in the harmonic lock state.

13. The DLL of claim 11, wherein the down signal output unit is configured to select the third path when the DLL is in a harmonic lock state, and to select the fourth path when the DLL is not in the harmonic lock state.

14. The DLL of claim 3, wherein the false lock prevention circuit comprises a false lock detector configured to select the up or the down signal and one or more of the plurality of delayed clock signals, to perform a logic operation on the selected clock signals, and to generate a specific signal as the operation result to announce that a stuck lock state has occurred.

15. The DLL of claim 14, wherein the false lock detector is configured to reset the phase detector according to the specific signal.

16. The DLL of claim 14, wherein the specific signal comprises a signal based on a pulse signal generated by using the selected clock signal and a clock signal delayed by a predetermined time from the selected clock signal.

17. The DLL of claim 16, wherein the pulse signal is generated by detecting one or more transition edges of the selected clock signal, the delayed clock signals, and a clock signal selected from the delayed clock signals.

18. A false lock prevention method comprising:
(a) generating a plurality of clock signals delayed from a reference clock signal;
(b) generating a clock signal divided from the reference clock signal;
(c) sampling the divided clock signal using at least a part of the delayed clock signals, and performing a logic operation on the sampled signals; and
(d) reducing delay times of the delayed clock signals according to the logic operation result, only when at least a part of the delay times of the delayed clock signals are equal to or more than a predetermined delay time from the reference clock signal.

19. The false lock prevention method of claim 18, wherein the predetermined delay time corresponds to one cycle of the reference clock signal or two or more integer multiples of one cycle of the reference clock signal.

20. A false lock prevention method comprising:
(a) generating a plurality of delayed clock signals delayed from a reference clock signal;
(b) selecting one of the delayed clock signals, and calculating a phase difference by comparing the phases of the selected signal and the reference clock signal;
(c) selecting another of the delayed clock signals, and detecting a transition edge;
(d) performing a logic operation on the detection result and the phase comparison result; and
(e) resetting the phase comparison according to the result of the logic operation.

21. The false lock prevention method of claim 20, wherein the detection result of the transition edge comprises a pulse signal shorter than a cycle of the reference clock signal.

22. The false lock prevention method of claim 21, wherein the pulse signal comprises a signal generated by performing a logic operation on the clock signal selected at the step (c) and a signal delayed from the clock signal selected at the step (c).

* * * * *